United States Patent
Rajpathak

(10) Patent No.: US 11,962,306 B2
(45) Date of Patent: Apr. 16, 2024

(54) CLOCK ANOMALY DETECTION

(71) Applicant: NVIDIA Corporation, Santa Clara, CA (US)

(72) Inventor: Kedar Rajpathak, Bengaluru (IN)

(73) Assignee: NVIDIA Corporation, Santa Clara, CA (US)

( * ) Notice: Subject to any disclaimer, the term of this patent is extended or adjusted under 35 U.S.C. 154(b) by 446 days.

(21) Appl. No.: 17/361,654

(22) Filed: Jun. 29, 2021

(65) Prior Publication Data

US 2022/0416776 A1   Dec. 29, 2022

(51) Int. Cl.
*H03K 5/19* (2006.01)
*G01R 13/02* (2006.01)
*G01R 29/02* (2006.01)
*G01R 29/027* (2006.01)

(52) U.S. Cl.
CPC .......... *H03K 5/19* (2013.01); *G01R 13/0218* (2013.01); *G01R 29/02* (2013.01); *G01R 29/023* (2013.01); *G01R 29/027* (2013.01); *G01R 29/0273* (2013.01)

(58) Field of Classification Search
CPC ...... H03K 5/19; G01R 13/0218; G01R 29/02; G01R 29/027; G01R 29/0273
USPC .......................................................... 713/502
See application file for complete search history.

(56) References Cited

U.S. PATENT DOCUMENTS

| | | | |
|---|---|---|---|
| 3,990,007 A | 11/1976 | Hohhof | |
| 4,128,892 A * | 12/1978 | Vasa | G01R 29/02 377/26 |
| 4,181,813 A * | 1/1980 | Marley | G10L 19/00 704/E11.005 |
| 4,286,255 A * | 8/1981 | Siy | G07C 9/35 382/207 |
| 4,355,283 A * | 10/1982 | Ott | H03K 3/017 327/175 |
| 4,388,653 A * | 6/1983 | Yamada | H04N 1/0678 358/302 |
| 4,532,561 A * | 7/1985 | Kimura | G11B 19/24 360/73.06 |
| 4,623,899 A * | 11/1986 | Sakakibara | B41J 2/375 400/54 |
| 4,722,004 A * | 1/1988 | Miyamoto | H04N 5/10 327/98 |
| 4,857,758 A * | 8/1989 | Rigazio | G04G 15/00 307/140 |

(Continued)

OTHER PUBLICATIONS

MC1455—Timers (Year: 2019).*

*Primary Examiner* — Paul R. Myers

(57) ABSTRACT

Methods and apparatus are described for detecting anomalies in a clock signal. Example methods include sensing a clock signal that exhibits alternating phases during normal operation; responsive to sensing the start of a first phase, generating a pulse; and if the pulse terminates before sensing the end of the first phase, asserting a clock stopped detection signal. Example clock anomaly detection apparatus includes a clock signal input for coupling to a clock signal that, during normal operation, oscillates between first and second clock states. An anomaly detection output is asserted if the clock signal remains in the first clock state longer than a first phase expected duration or remains in the second clock state longer than a second phase expected duration.

30 Claims, 17 Drawing Sheets

(56) References Cited

U.S. PATENT DOCUMENTS

| | | | | |
|---|---|---|---|---|
| 4,885,743 A * | 12/1989 | Helbers | | H04L 12/413 |
| | | | | 370/445 |
| 4,982,350 A * | 1/1991 | Perna | | G04F 10/04 |
| | | | | 702/89 |
| 5,087,915 A * | 2/1992 | Toya | | G06F 3/05 |
| | | | | 341/126 |
| 5,124,597 A * | 6/1992 | Stuebing | | H03K 5/133 |
| | | | | 377/110 |
| 5,386,405 A * | 1/1995 | Fujiwara | | G11B 19/04 |
| | | | | 360/32 |
| 5,438,328 A * | 8/1995 | Kweon | | G01R 29/0273 |
| | | | | 340/12.18 |
| 5,448,743 A * | 9/1995 | Gulick | | G06F 13/24 |
| | | | | 710/262 |
| 5,528,443 A * | 6/1996 | Itoga | | H01H 9/542 |
| | | | | 361/13 |
| 6,115,318 A | 9/2000 | Keeth | | |
| 6,341,355 B1 * | 1/2002 | Rutherford | | G06F 1/08 |
| | | | | 713/501 |
| 7,098,706 B1 * | 8/2006 | Pasqualini | | G06F 1/12 |
| | | | | 327/141 |
| 11,327,525 B1 | 5/2022 | Salluzzo et al. | | |
| 2002/0067787 A1 * | 6/2002 | Naven | | H03L 7/07 |
| | | | | 375/359 |
| 2004/0076193 A1 * | 4/2004 | Nakano | | H04B 10/2589 |
| | | | | 370/526 |
| 2005/0022060 A1 * | 1/2005 | Hashimoto | | G05B 19/0428 |
| | | | | 714/37 |
| 2005/0066211 A1 | 3/2005 | Heinrich et al. | | |
| 2005/0091620 A1 * | 4/2005 | Aipperspach | | H03K 5/1565 |
| | | | | 327/100 |
| 2005/0238119 A1 * | 10/2005 | Zhu | | H03K 5/082 |
| | | | | 375/316 |
| 2005/0276085 A1 | 12/2005 | Winn | | |
| 2006/0126412 A1 * | 6/2006 | Maki | | G11C 29/50 |
| | | | | 365/201 |
| 2007/0114986 A1 * | 5/2007 | Yoshii | | H02M 3/1588 |
| | | | | 323/288 |
| 2009/0256615 A1 | 10/2009 | Suzuki | | |
| 2011/0286542 A1 * | 11/2011 | Shelburne | | H04L 27/12 |
| | | | | 375/272 |
| 2012/0109259 A1 | 5/2012 | Bond et al. | | |
| 2012/0155524 A1 * | 6/2012 | Yoshida | | H04L 25/4902 |
| | | | | 375/238 |
| 2013/0089223 A1 * | 4/2013 | Heineman | | H03F 3/185 |
| | | | | 381/120 |
| 2014/0035560 A1 | 2/2014 | Olmos et al. | | |
| 2014/0102219 A1 | 4/2014 | Kuwahara et al. | | |
| 2014/0232434 A1 | 8/2014 | Koazechi et al. | | |
| 2015/0278416 A1 | 10/2015 | Darbari | | |
| 2016/0006544 A1 | 1/2016 | Cowley et al. | | |
| 2017/0222796 A1 * | 8/2017 | Chen | | H04L 7/0337 |
| 2017/0261966 A1 | 9/2017 | Tarui | | |
| 2017/0344052 A1 | 11/2017 | Hegde | | |
| 2018/0032391 A1 * | 2/2018 | Furuya | | G06F 11/079 |
| 2018/0164419 A1 | 6/2018 | Arlelid et al. | | |
| 2021/0205604 A1 | 7/2021 | Andersen et al. | | |
| 2022/0165322 A1 | 5/2022 | Choi et al. | | |
| 2023/0034831 A1 | 2/2023 | Hayashi | | |

\* cited by examiner

CLOCK ANOMALY DETECTION

BACKGROUND

Most digital systems rely on a clock signal in order to function. For example, virtually all modern computing platforms—such as, for example, mobile devices, desktop computers, and rack-mounted compute nodes in data centers—depend on a system clock signal to execute instructions that enable them to perform their intended functions.

A typical clock signal is generated by a circuit that includes a quartz crystal to ensure very accurate and stable oscillations. When properly functioning, a clock signal so generated oscillates between two opposite state phases corresponding, respectively, to a "high" state and a "low" state. Usually a clock signal oscillates at a fixed clock frequency, in which a single oscillation cycle corresponds to a fixed clock period having a duration that depends on the fixed clock frequency. In most systems, the clock signal is designed to oscillate with a 50% duty cycle. That is, during each clock cycle, the clock signal is designed to exhibit a stable high state for one half of the clock period and a stable low state for the other half of the clock period. These states repeat in a strictly alternating fashion from one clock cycle to the next. In some systems, the clock signal may be designed to oscillate with a duty cycle other than 50%.

In any of such systems, one type of clock anomaly occurs when the clock stops oscillating entirely (a clock "stop"). Another type of clock anomaly occurs when the clock abruptly and temporarily exhibits a duty cycle other than the expected duty cycle (a clock "glitch"). Any of such anomalies can be cause for concern in a digital system because their occurrence may cause the system to behave unexpectedly and may create vulnerabilities to security attacks that are designed to exploit timing.

It is desirable, therefore, to detect clock anomalies if and when they occur and to respond to them quickly.

DETAILED DESCRIPTION

Nomenclature

This disclosure describes multiple embodiments by way of example and illustration. It is intended that characteristics and features of all described embodiments may be combined in any manner consistent with the teachings, suggestions and objectives contained herein. Thus, phrases such as "in an embodiment," "in one embodiment," and the like, when used to describe embodiments in a particular context, are not intended to limit the described characteristics or features only to the embodiments appearing in that context.

The phrases "based on" or "based at least in part on" refer to one or more inputs that can be used directly or indirectly in making some determination or in performing some computation. Use of those phrases herein is not intended to foreclose using additional or other inputs in making the described determination or in performing the described computation. Rather, determinations or computations so described may be based either solely on the referenced inputs or on those inputs as well as others.

The phrases "configured to," "operable to" and the like as used herein mean that the referenced item, when operated, can perform the described function. In this sense an item can be "configured to" perform a function or can be "operable to" perform a function even when the item is not operating and is therefore not currently performing the function. Use of the phrases "configured to" or "operable to" herein do not necessarily mean that the described item has been modified in some way relative to a previous state.

"Coupled" as used herein refers to a connection between items. Such a connection can be direct or can be indirect through connections with other intermediate items.

Terms used herein such as "including," "comprising," and their variants, mean "including but not limited to."

Articles of speech such as "a," "an," and "the" as used herein are intended to serve as singular as well as plural references. Thus, the articles "a" and "an" as used herein may generally be interpreted to mean "one or more," and the article "the" as used herein may generally be interpreted to mean "the one or more."

The terms "assertion," "asserted" and the like as used herein refer to a voltage level that corresponds to a Boolean "true" value in a given circuit. Such a voltage level may be a low voltage level or a high voltage level depending on the design convention used in relation to a particular circuit. In the context of a circuit that follows an "asserted-low" design convention, for example, asserting a node would correspond to establishing a low voltage level on the node. The opposite would be the case in a circuit that follows an "asserted-high" design convention. The asserted-low and the asserted-high design conventions are opposite but equivalent. Thus, examples or descriptions provided herein in terms of one such design convention should be construed to apply equally to the other design convention.

Clock Anomaly Detection Circuitry and Host Systems

Figure 1:
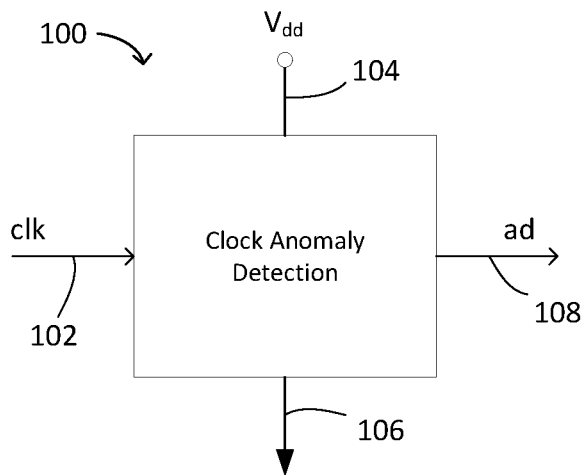
FIG. 1 is a block diagram illustrating an example clock anomaly detection system in accordance with embodiments.

FIG. 1 is a block diagram illustrating example clock anomaly detection circuitry 100 in accordance with embodiments. The circuitry has a clock signal input 102 for coupling to any type of clock signal—such as, for example, any of those described above or any of those described below in relation to FIGS. 3-5. The circuitry is coupled to a power supply as shown at 104 and to a ground return path as shown at 106. The power supply provides the circuitry with a supply voltage having a supply voltage level, as indicated in the drawing with the symbol $V_{dd}$. The circuitry provides an anomaly detection output 108. Clock stopped detection logic (to be further described below) within the clock anomaly detection circuitry is coupled to the clock signal input and is operable to assert the anomaly detection output responsive to sensing an anomaly in the clock signal. In various embodiments, it may do so without reference to any clock other than to the clock signal that is coupled to the clock signal input.

Figure 2:
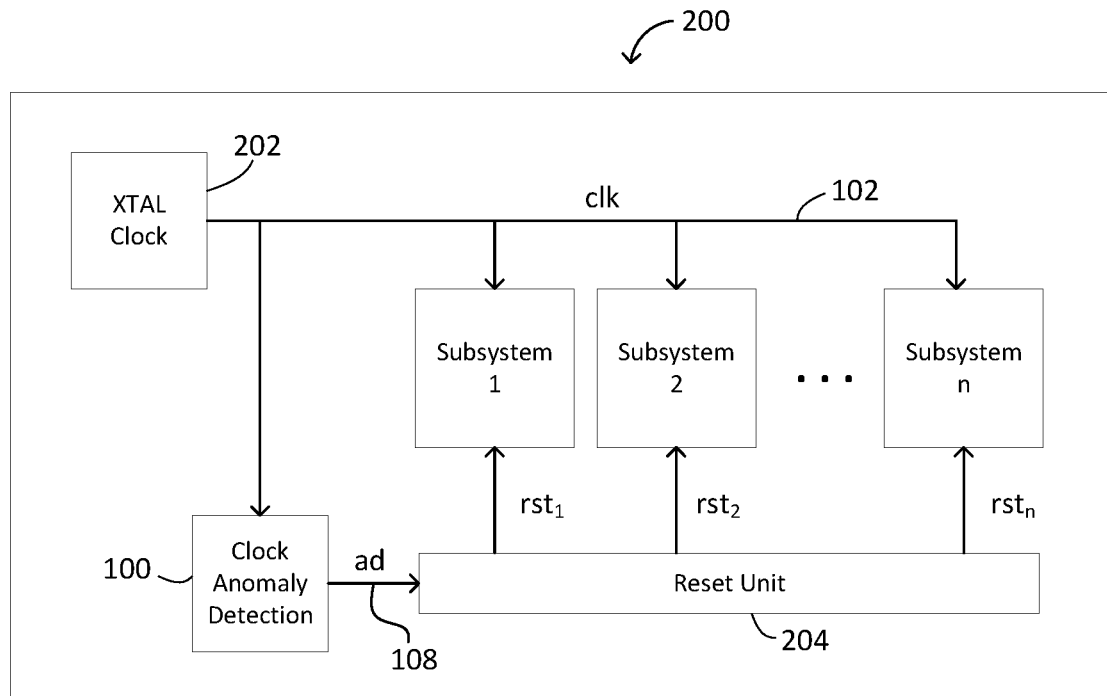
FIG. 2 is a block diagram illustrating an example host system utilizing the clock anomaly detection system of FIG. 1 in accordance with embodiments.

FIG. 2 illustrates an example host system 200 utilizing the clock anomaly detection system of FIG. 1 in accordance with embodiments. Host system 200 may correspond to any system that includes one or more subsystems, such as subsystems 1-$n$, that operate responsive to a clock signal 102. For example, any of the subsystems may correspond to a central processing unit ("CPU"), a graphics subsystem comprising one or more graphics processing units ("GPUs"), a memory controller, or any other subsystems that are typically present in a computing device or in an add-in card or peripheral that is designed to function with a computing device. The clock signal for such a system may be generated by a crystal clock circuit 202 housed within the host system, or the clock signal may be generated elsewhere and coupled to the host system. Each of the subsystems, as well as the clock anomaly detection circuit, may derive power from a common $V_{dd}$ node or $V_{dd}$ "rail."

In the embodiment shown, the anomaly detection output, labeled "ad" in the drawing, is coupled to an input of a reset unit 204. The reset unit provides one or more reset outputs, labeled $rst_1$ to $rst_n$ in the drawing, that are coupled to reset inputs of the subsystems. In such embodiments, the reset unit operates to assert the reset outputs responsive to an assertion of the anomaly detection output. It may do so in any appropriate manner. In some embodiments, it may do so according to a reset sequence that may depend on the types of the subsystems and their interconnections, in order to achieve a controlled reset of the overall host system. In other embodiments, it may assert each of the reset outputs simultaneously. In still further embodiments, the anomaly detection output may instead be applied directly to a reset input of any one or more of the subsystems. In any such embodiments, each subsystem may transition from an operating state to a reset state responsive to an assertion of its reset input. The duration of an assertion on the anomaly detection output or on any of the reset outputs may vary as appropriate to the design of a given host system.

Clock Signal Terminology

Figure 3:
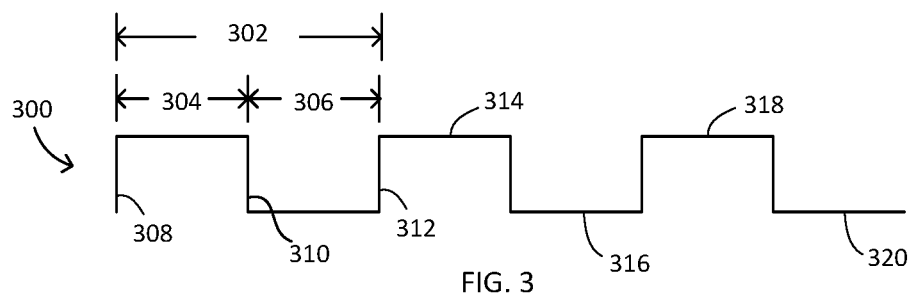
FIGS. 3-5 are timing diagrams illustrating example clock signals.
Figure 4:
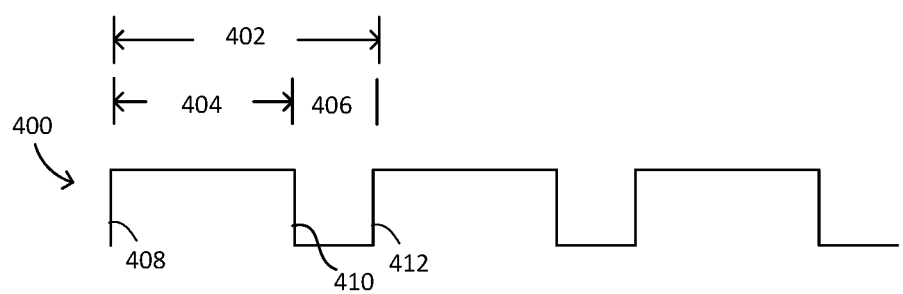
Figure 5:
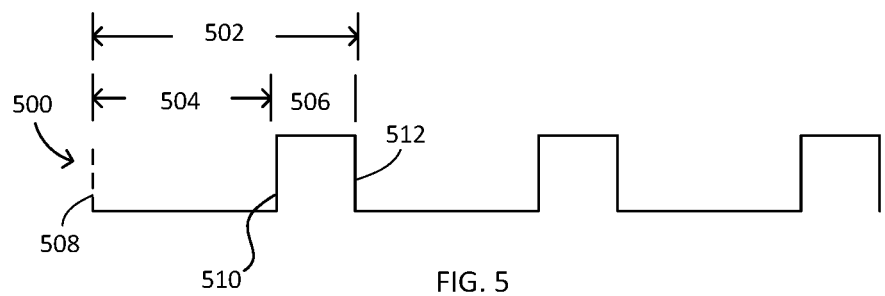

Clock signals such as those described above may take a variety of forms. FIGS. 3-5 illustrate several example clock signals for purposes of explanation. Each of clock signals 300, 400, 500 exhibits cycles 302, 402, 502 during normal operation. A clock cycle corresponds to one clock period (a "cycle time"). As was mentioned above, the duration of a clock period or cycle time for a given clock signal depends on the frequency at which the clock signal oscillates. For example, a clock signal oscillating at a frequency of 1 GHz exhibits $10^9$ cycles per second and exhibits a clock period or cycle time having a duration of $10^{-9}$ seconds.

Each clock cycle includes two opposite-state phases 304/306, 404/406, 504/506. The two phases in each cycle are opposite-state phases in the sense that one of them corresponds to a clock state having a "high" voltage level (a "high phase" or "high clock state") while the other corresponds to a clock state having a "low" voltage level (a "low phase" or "low clock state"). As used herein, "high" and "low" are relative terms. A high voltage level may be, but need not be, substantially equal to $V_{dd}$, and a low voltage level may be, but need not be, substantially equal to ground. A high voltage level may correspond to a Boolean "true" value while a low voltage level may correspond to a Boolean "false" value or vice versa, depending on the design convention used for a given digital system.

Each phase of a clock signal has a start or a beginning, and each phase has an end. For example, phases 304, 404, 504 each have a start or a beginning 308, 408, 508, and each has an end 310, 410, 510. Similarly, phases 306, 406, 506 each have a start or a beginning 310, 410, 510, and each has an end 312, 412, 512.

A clock "edge" as used herein refers to a transition from one clock state to another in a clock signal. A clock edge may have one of two directions depending on whether the corresponding transition is from a low state to a high state (a "rising edge") or from a high state to a low state (a "falling edge"). For example, the beginnings 308, 408 of clock phases 304, 404 each correspond to a rising edge of the respective clock signal, while the ends 310, 410 of clock phases 304, 404 each correspond to a falling edge of the respective clock signal.

In clock signals that oscillate between opposite-state phases, the end of a previous phase may be equivalent to the start or beginning of a subsequent phase that immediately follows the previous phase. In embodiments, the start or beginning of any clock phase may be detected using a variety of techniques such as by detecting a clock edge, or by sensing a high or a low voltage level in the clock signal, or both.

The phrase "duty cycle" as used herein refers to a ratio between the high phase duration for a clock signal and the cycle period for the clock signal. Clock signal 300 is an example of a clock signal having a 50% duty cycle, since each of opposite-state phases 304, 306 has the same duration. Thus, the duration of high phase 304 is half that of cycle period 302. Clock signal 400 may be said to have a 70% duty cycle, since high phase 404 occupies 70% of clock period 402. Clock signal 500 may be said to have a 30% duty cycle, since high phase 506 occupies 30% of clock period 502. Embodiments to be described below may be used with clock signals having any duty cycle.

"Phase instance" as used herein refers to any one occurrence of any phase of a clock signal. For purposes of illustration, six phase instances of clock signal 300 are labeled in FIG. 3. High phase 304 represents a first phase instance of the clock signal, and low phase 306 represents a second phase instance of the clock signal. Similarly, phases 314, 316, 318 and 320 represent third, fourth, fifth and sixth phase instances of the clock signal, respectively. In this sense each of the clock signals comprises a series of clock phase instances. Moreover, phases 304, 314 and 318 may be said to correspond to first, second and third instances of the high phase of the clock signal, while phases 306, 316 and 320 may be said to correspond to first, second and third instances of the low phase of the clock signal.

Example Structures and Methods

Figure 6:
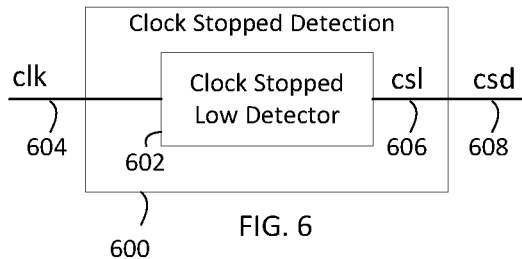
FIG. 6 is a block diagram illustrating a clock stopped low detector in accordance with embodiments.
Figure 7:
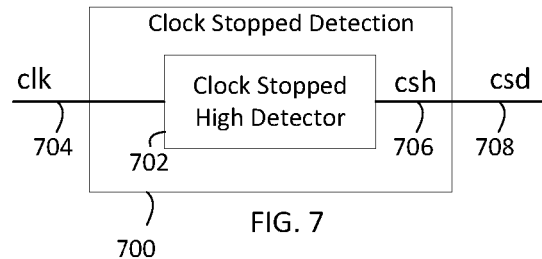
FIG. 7 is a block diagram illustrating a clock stopped high detector in accordance with embodiments.
Figure 8:
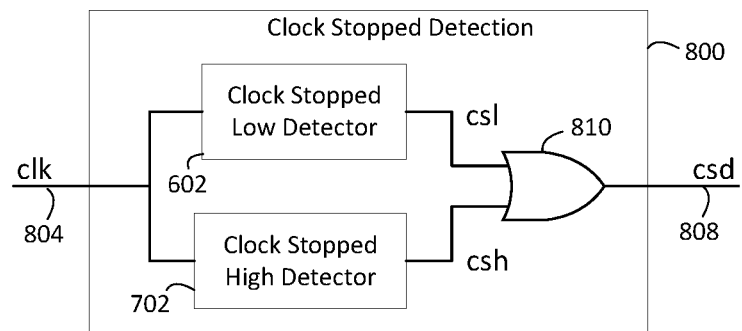
FIG. 8 is a block diagram illustrating a clock stop detection system utilizing the clock stopped low detector of FIG. 6 and the clock stopped high detector of FIG. 7 in accordance with embodiments.

FIGS. 6-8 are block diagrams schematically illustrating several example implementations of the clock stopped detection logic described above.

In the example of FIG. 6, clock stopped detection logic 600 is implemented using a clock stopped low detector 602. The clock stopped low detector is coupled to a clock signal input 604 and provides a clock stopped low output 606. The clock stopped low output is asserted when the detector senses that the clock signal has remained in a low clock state for longer than an expected low phase duration (a clock anomaly). In the illustrated embodiment, a clock stopped detection output 608 is coupled directly to the clock stopped low output.

In the example of FIG. 7, clock stopped detection logic 700 is implemented using a clock stopped high detector 702. The clock stopped high detector is coupled to a clock signal input 704 and provides a clock stopped high output 706. The clock stopped high output is asserted when the detector senses that the clock signal has remained in a high clock state for longer than an expected high phase duration (a clock anomaly). In the illustrated embodiment, a clock stopped detection output 708 is coupled directly to the clock stopped high output.

As persons having skill in the art will appreciate, an expected low phase duration or an expected high phase duration for a give clock signal will depend on the clock period of the clock signal and on its duty cycle.

In the example of FIG. 8, clock stopped detection logic 800 is implemented using both a clock stopped low detector 602 and a clock stopped high detector 702. Like logic 600 and 700, logic 800 has a clock signal input 804 and a clock stopped detection output 808, but logic 800 also includes circuitry for asserting the clock stopped detection output based on the respective outputs of the clock stopped low detector and the clock stopped high detector. This circuitry may be implemented in a variety of ways. In some embodiments, it may be implemented using one or more Boolean logic circuits coupled to the clock stopped low output and to the clock stopped high output and configured to assert the clock stopped detection output if either of the clock stopped low or the clock stopped high outputs is asserted. For example, the Boolean logic may comprise a logical NOR or a logical OR of the clock stopped low and the clock stopped high outputs. The latter implementation is shown in the illustrated embodiment and is represented by OR gate 810.

Figure 9:
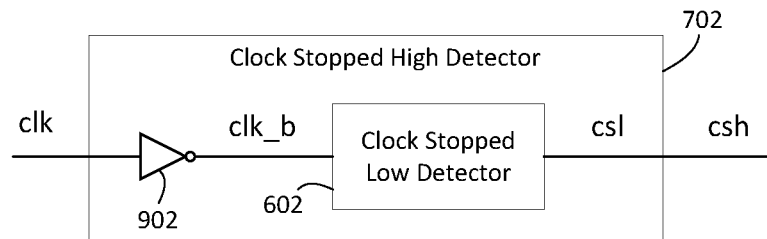
FIG. 9 is a block diagram illustrating an example embodiment of the clock stopped high detector of FIG. 7 implemented using the clock stopped low detector of FIG. 6.
Figure 10:
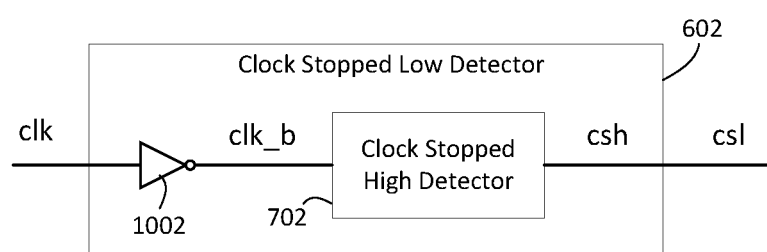
FIG. 10 is a block diagram illustrating an example embodiment of the clock stopped low detector of FIG. 6 implemented using the clock stopped high detector of FIG. 7.

A clock stopped low detector such as detector 602 and a clock stopped high detector such as detector 702 may be implemented in various ways, as persons having skill in the art will appreciate. Indeed, if desired, one may be implemented using the other. For example, as shown in FIG. 9, a clock stopped high detector may be implemented by inverting the clock signal input of a clock stopped low detector (as indicated by inverter 902 in the drawing), or by coupling the clock signal input to an inverted version of the clock signal generated elsewhere. Similarly, as shown in FIG. 10, a clock stopped low detector may be implemented by inverting the clock signal input of a clock stopped high detector (as indicated by inverter 1002 in the drawing), or by coupling the clock signal input to an inverted version of the clock signal generated elsewhere.

In various embodiments, any of the clock stopped detection outputs of FIGS. 6-10 may constitute an anomaly detection output such as that shown in FIGS. 1-2, because each of them is asserted responsive to the detection of at least one type of clock anomaly.

Figure 11:
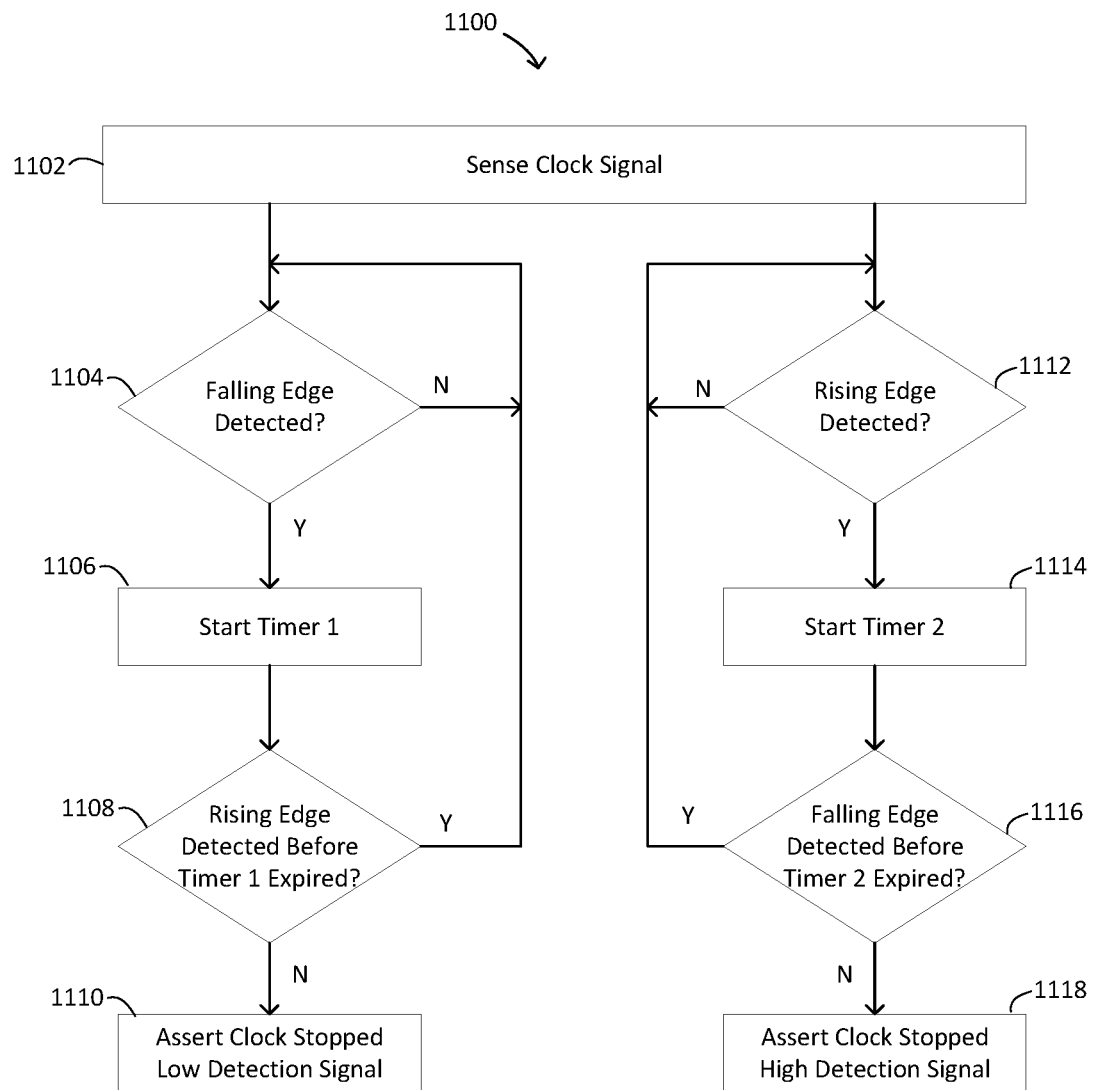
FIG. 11 is a flow diagram illustrating a first example method for clock anomaly detection in accordance with embodiments.
Figure 12:
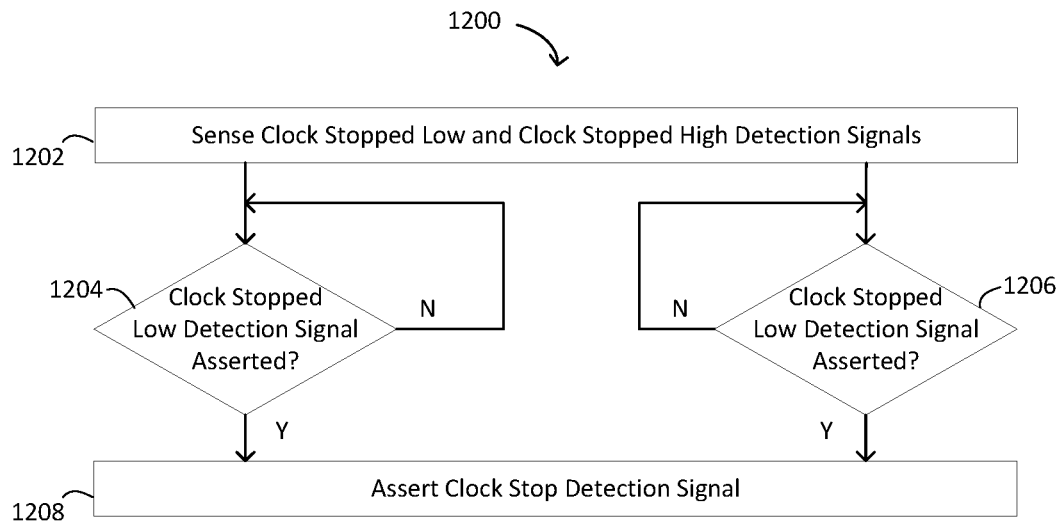
FIG. 12 is a flow diagram illustrating a second example method for clock anomaly detection in accordance with embodiments.
Figure 13:
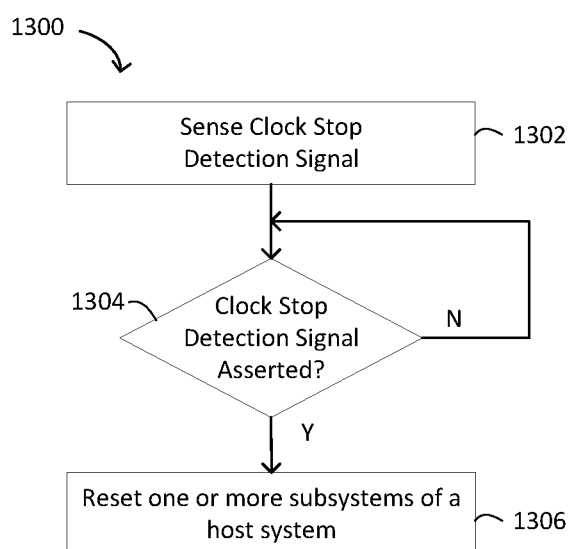
FIG. 13 is a flow diagram illustrating a third example method for clock anomaly detection in accordance with embodiments.

FIGS. 11-13 are flow diagram illustrating a first set of example methods for clock anomaly detection in accordance with embodiments. In some embodiments, some or all of the functions described in the methods of FIGS. 11-13 may be implemented in hardware structures, such as in any of the hardware structures described herein. In such embodiments, the functions described in the methods may represent behaviors to be implemented by the corresponding hardware structures.

Referring now to FIG. 11, method 1100 begins at step 1102 with sensing a clock signal such as any of those described above. In steps 1104 and 1106, a first timer is started responsive to sensing the beginning of a low phase instance of the clock signal. As was described above, the beginning of a low phase instance may be detected in a variety of ways. In the illustrated embodiment, the beginning of the low phase instance is detected by detecting a falling edge of the clock signal at step 1104. The duration of the first timer is designed to be at least as long as an expected duration of the low phase instance. In some embodiments, the duration of the first timer may be substantially equal to the expected duration of the low phase instance. In these and other embodiments, the duration of the first timer may be designed to be less than or equal to the expected duration of a cycle time of the clock signal. In steps 1108 and 1110, a clock stopped low detection signal is asserted if the first timer expires before the end of the low phase instance is sensed. As was discussed above, the end of any clock phase may be detected in a variety of ways. In the illustrated embodiment, the end of the low phase instance is sensed by detecting a rising edge in the clock signal at step 1108. If the end of the low phase instance is sensed before the first timer expires, then the method resumes at step 1104.

Steps 1112-1118 are analogous to steps 1104-1110 except that they relate to a high phase instance of the clock signal. In steps 1112 and 1114, a second timer is started responsive to sensing the beginning of a high phase instance of the clock signal. In the illustrated embodiment, this is achieved by detecting a rising edge of the clock signal in step 1112. In steps 1116 and 1118, a clock stopped high detection signal is asserted if the second timer expires before the end of the high phase instance is sensed. In the illustrated embodiment, the end of the high phase instance is sensed by detecting a falling edge of the clock signal at step 1116. If the end of the high phase instance is sensed before the second timer expires, then the method resumes at step 1112. The duration of the second timer is designed to be at least as long as an expected duration of the high phase instance. In some embodiments, the duration of the second timer may be substantially equal to the expected duration of the high phase instance. In these and other embodiments, the duration of the second timer may be designed to be less than or equal to the expected duration of a cycle time of the clock signal.

In various embodiments, method 1100 may comprise just steps 1104-1110, or just steps 1112-1118. In other embodiments, both sets of steps may be included. In such embodiments, steps 1104-1110 may be performed concurrently with steps 1112-1118, or they may be performed before or after steps 1112-1118. In any such embodiments, the low phase detected by steps 1104-1110 may or may not occur within the same cycle of the clock signal as does the high phase detected by steps 1112-1118. In embodiments wherein the clock signal is expected to exhibit a 50% duty cycle, the durations of the first and second timers may be equal. In still further embodiments, the first and second timers may correspond to the same timer.

FIG. 12 illustrates a further example method 1200 for clock anomaly detection in accordance with embodiments. The method begins at step 1202 with sensing clocked stopped low and clock stopped high detection signals such as those described in method 1100. Responsive to sensing an assertion of the clock stopped low detection signal (step 1204), the method asserts a clock stop detection signal (step 1208). Similarly, responsive to sensing an assertion of the clock stopped high detection signal (step 1206), the method asserts the clock stop detection signal (step 1208). In various embodiments, steps 1204 and 1206 may be performed concurrently, or they may be performed sequentially.

FIG. 13 illustrates a further example method 1300 for clock anomaly detection in accordance with embodiments. The method begins at step 1302 with sensing a clock stop detection signal such as the one described in method 1200. Responsive to sensing an assertion of the clock stop detection signal (step 1304), the method resets one or more subsystems of a host system at step 1306. This may be achieved in different ways in various embodiments. For example, the one or more subsystems may be reset directly by the clock stop detection signal, or they may be reset in a more controlled manner by a reset unit that is activated by an assertion of the clock stop detection signal. In still further embodiments, methods 1200 and 1300 may be combined and the clock stop detection signal of steps 1208, 1302 may be eliminated, such that the method resets the one or more subsystems of the host system responsive to an assertion of either the clock stopped low detection signal described in step 1204 or the clock stopped high detection signal described in step 1206.

Pulse Durations as Timers

A timer suitable for use in embodiments may be implemented in any suitable manner. In some embodiments, such a timer may be implemented using one or more pulse generators. In these embodiments, the step of starting the timer may comprise generating a pulse having a duration that corresponds to a desired duration of the timer, and the step of determining if the timer has expired before the end of a given phase instance of the clock signal has occurred may comprise comparing a state of the pulse with the state of the clock signal (or, depending on the embodiment and as appropriate, to an inverse of the clock signal, to a phase extended version of the clock signal, or to a phase extended version of the inverse of the clock signal.)

In the latter class of embodiments, either a clock stopped low detector or a clock stopped high detector or both may be implemented using one or more edge triggered pulse generators and one or more Boolean logic circuits. To illustrate this, the following discussion will present example implementations of clock stopped low detectors. Persons having skill in the art and having reference to this disclosure will appreciate that the same or similar principles may be applied to implement clock stopped high detectors as well. Moreover, as persons having skill in the art and having reference to this disclosure will also appreciate, any of the embodiments described herein as being implemented with one or more falling edge triggered pulse generators may equivalently be implemented using rising edge triggered pulse generators.

Figure 14:
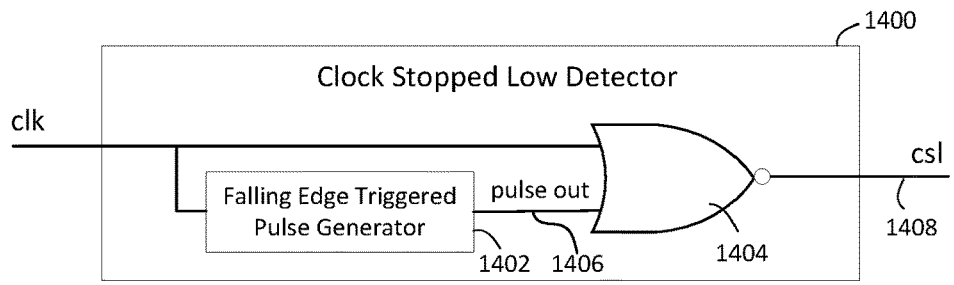
FIG. 14 is a block diagram illustrating an example embodiment of the clock stopped low detector of FIG. 6 implemented using a falling edge triggered pulse generator.

Referring now to FIG. 14, clock stopped low detector 1400 includes a falling edge triggered pulse generator 1402 and a Boolean logic circuit 1404. The detector is coupled to a clock signal at its clk input as shown. When triggered by a falling edge of the clock signal, the pulse generator generates a pulse at a pulse output 1406. If the clock signal is behaving normally, the falling edge should signify the start of a low phase instance of the clock signal. The pulse generator is designed such that the duration of the generated pulse will be at least as long as the expected duration of the low phase instance. The Boolean logic circuit (a NOR gate in the illustrated embodiment) is configured to indicate, at a clock stopped low output 1408, if the pulse ends before the clock signal exhibits a rising edge (i.e., before the end of the low phase instance that triggered the pulse).

Figure 15:
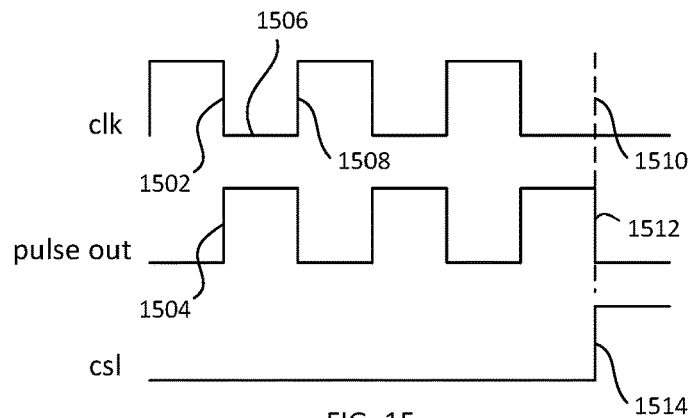
FIG. 15 is a timing diagram illustrating the operation of the embodiment of FIG. 14.

The behavior of detector 1400 is illustrated in the timing diagram of FIG. 15. Because one input of NOR gate 1404 is coupled to the clock signal and the other input of the NOR gate is coupled to the pulse output of the edge triggered pulse generator, csl output 1408 stays low as long as either the clock signal or the pulse output is high. For example, falling edge 1502 of the clock signal triggers pulse 1504. The duration of the pulse is at least as long as the expected normal duration of phase instance 1506, so the pulse output stays high at least until a rising edge 1508 occurs, signifying the end of low phase instance 1506. During normal clock operation, at least one of the clock signal or the output pulse keeps the csl output in its low, un-asserted state. At time 1510, however, the clock signal behaves abnormally and remains in a low phase for longer than the expected low phase duration. In this circumstance, the output pulse terminates while the clock signal remains in its low phase, as can be seen at 1512. Because the clock signal and the pulse output are both low after time 1510, the NOR gate asserts the csl output at 1514.

Figure 16:
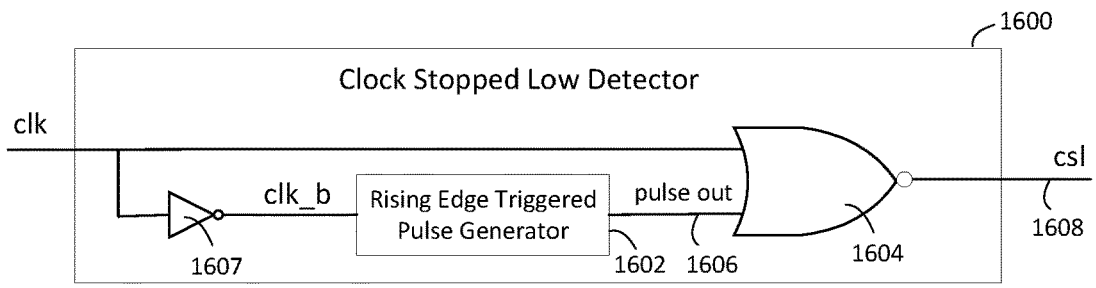
FIG. 16 is a block diagram illustrating an example embodiment of the clock stopped low detector of FIG. 6 implemented using a rising edge triggered pulse generator.

The structure of embodiment of FIG. 14 has been presented by way of example and not by way of limitation. In other embodiments, different implementations may be used. For example, a clock stopped low detector may also be implemented using different Boolean logic than that shown in FIG. 14. An OR gate might be used instead of a NOR gate, for example, in a circuit that employs the asserted-low design convention. Moreover, such a detector may be implemented using a rising edge triggered pulse generator rather than a falling edge triggered pulse generator. FIG. 16 provides an illustrative example of the latter class of embodiments.

Referring now to FIG. 16, clock stopped low detector 1600 is analogous to the implementation of FIG. 14 except that the falling edge triggered pulse generator is replaced with a rising edge triggered pulse generator 1602, and except that the input of the rising edge triggered pulse generator is coupled to an inverted version of the clock signal instead of to the clock signal, as indicated by inverter 1607. Like embodiment 1400, embodiment 1600 has a pulse output 1606 and a csl output 1608. One of the inputs of NOR gate 1604 is coupled to the clock signal, while the other input of the NOR gate is coupled to the pulse output.

Figure 17:
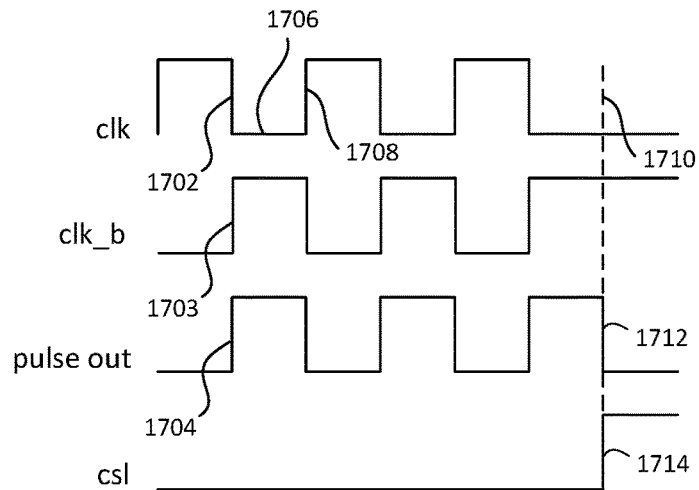
FIG. 17 is a timing diagram illustrating the operation of the embodiment of FIG. 16.

The behavior of detector 1600 is illustrated in the timing diagram of FIG. 17. As can be seen in the timing diagram, embodiment 1600 functions in the same manner as does embodiment 1400. Falling edge 1702 of the clock signal is equivalent to rising edge 1703 in the inverted clock signal. Rising edge 1703 triggers output pulse 1704, which has a duration at least as long as an expected normal duration of low phase instance 1706 of the clock signal. During normal operation of the clock signal, a next rising edge will occur while the pulse output remains high, as indicated at 1708. Should the clock signal remain in its low phase for longer than the expected time, however, as indicated at time 1710, the output pulse will terminate while the clock signal remains low, as indicated at 1712. At that time, NOR gate 1604 will assert the corresponding csl output at 1714, indicating a clock anomaly.

General Timing Constraints for Eliminating False Assertions

Successful embodiments may be designed using the clock stopped detectors of FIGS. 14 and 16 without more. Certain timing variations, however, if not accounted for in such embodiments, may cause undesired behaviors to occur under certain conditions. Specifically, the timing diagrams of FIGS. 18 and 19 illustrate first and second conditions that, if present, can cause false assertions to occur on the outputs of either of the clock stopped low detectors of FIGS. 14 and 16.

Figure 18:
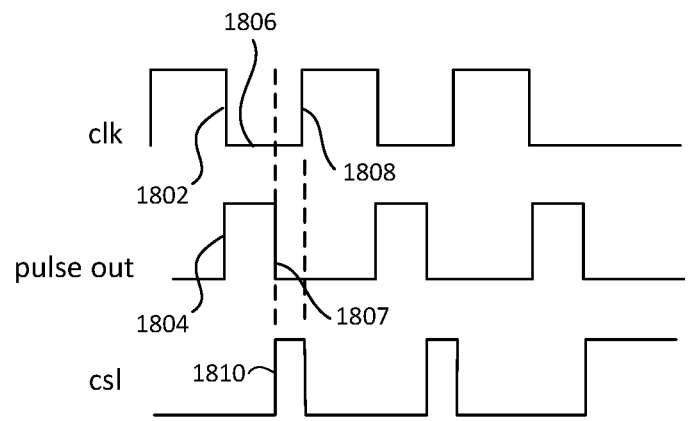
FIGS. 18 and 19 are timing diagrams illustrating first and second conditions, respectively, under which false assertions could occur on the outputs of the clock stopped low detectors of FIG. 14 and FIG. 16.

The first condition, illustrated in FIG. 18, occurs when the duration of the pulse generated by the edge triggered pulse generator is shorter than an expected normal duration of the corresponding clock phase. For example, in the illustration, falling edge 1802 of the clock signal causes a pulse 1804 to be generated by the edge triggered pulse generator, but the duration of the pulse is not as long as the corresponding normal low phase 1806 of the clock signal. The result is that the pulse ends at time 1807 while the clock signal remains in its low phase. Consequently, the clock stopped low signal goes high briefly at 1810 until the beginning of the next phase of the clock signal occurs at time 1808. This brief assertion of the csl output is a false assertion because the assertion occurs when the clock signal is behaving normally.

Figure 19:
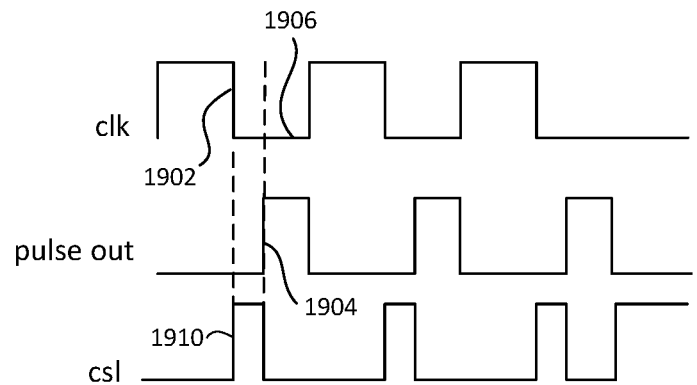

The second condition, illustrated in FIG. 19, occurs when the beginning of the pulse that is generated by the edge triggered pulse generator is delayed relative to the start of the corresponding clock phase. For example, in the illustration, falling edge 1902 of the clock signal (or, in some embodiments, an earlier falling edge) causes pulse 1904 to be generated, but the beginning of the pulse is delayed relative to the start of the phase 1906 to which the pulse should correspond. In this circumstance, the csl output is briefly asserted at 1910 because the clock signal and the pulse output are both low during the time after the falling edge of the clock and before the beginning of the pulse. This brief assertion is also a false assertion because, when this timing sequence exists, the assertion will occur even when the clock signal is behaving normally.

Figure 20:
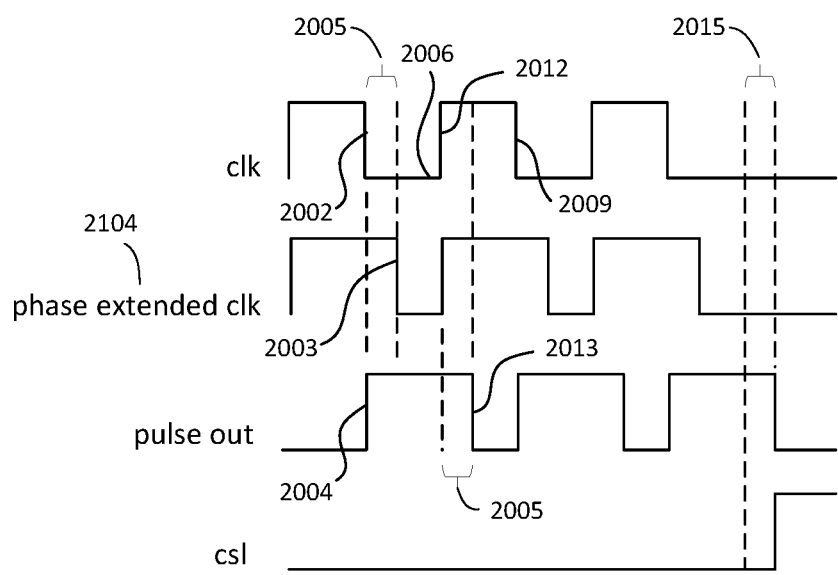
FIG. 20 is a timing diagram illustrating conditions under which the false assertions of FIGS. 18 and 19 may be eliminated.

The timing diagram of FIG. 20 illustrates general timing constraints that may be employed to eliminate the false assertions of FIGS. 18 and 19, provided the constraints are ensured to hold over all expected operating conditions of the clock anomaly detector.

False assertion 1810 may be eliminated in general by ensuring that the pulse that is generated by the edge triggered pulse generator will be at least as long as an expected normal duration of the corresponding clock phase under all expected operating conditions of the clock anomaly detector. This is illustrated in FIG. 20, in which the duration of generated pulse 2004 is slightly longer than that of the corresponding normal low phase 2006 of the clock signal (see bracket 2005). Provided that the pulse duration is also less than the expected normal cycle time of the clock signal under all expected operating conditions, the pulse generator will again be available to generate a new pulse when the next falling edge of the clock signal occurs at 2009. False assertion 1810 is eliminated under these conditions because, when the clock signal is behaving normally, the next phase of the clock signal will begin at 2012 before the pulse terminates at 2013. Thus, at least one of the inputs to NOR gate 1404 or NOR gate 1604 will be high at the end of any low phase instance that has a normal duration.

False assertion 1910 may be eliminated in general by coupling a phase extended version of the clock signal to the NOR gate input that, in the embodiments of FIGS. 14 and 16, is coupled directly to the clock signal. An example of a phase extended version of the clock signal is illustrated by signal 2014 in the timing diagram of FIG. 20. The phase extended version is labeled "phase extended clk." The illustrated phase extended version of the clock signal is the same as the clock signal except that all falling edges 2003 in the phase extended clock signal are delayed relative to the corresponding falling edges 2002 in the clock signal (see bracket 2005). In embodiments that apply this approach, one of the inputs to the NOR gate may be coupled to the pulse output, while the other input may be coupled to the phase extended version of the clock signal. Under these conditions, false assertions 1910 will be eliminated because falling edges 2003 are delayed by a time sufficiently long to allow the corresponding pulse 2004 to begin. Thus, at least one of the inputs to the NOR gate will be high at the beginning of any low phase instance, which prevents the falls assertions.

When employed, the timing safeguards illustrated in FIG. 20 are effective to eliminate the false assertions of FIGS. 18-19. Note, however, that in embodiments where the output pulse is substantially longer than the expected duration of a corresponding clock phase, a latency may be introduced before a clock anomaly is detected, as indicated at bracket 2015. Embodiments that are capable of reducing or eliminating this latency will be described in the sections that follow further below.

Figure 21:
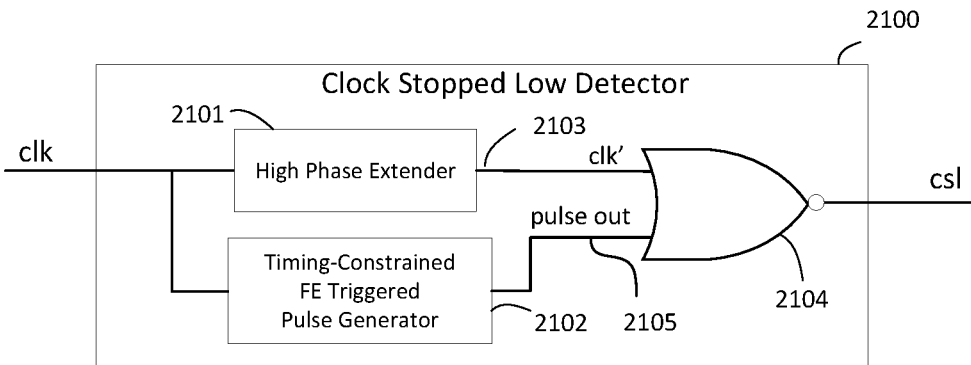
FIGS. 21 and 22 are block diagrams illustrating example embodiments of the clock stopped low detectors of FIGS. 14 and 16, respectively, each implemented using a high phase extender and a timing constrained edge triggered pulse generator in accordance with embodiments.
Figure 22:
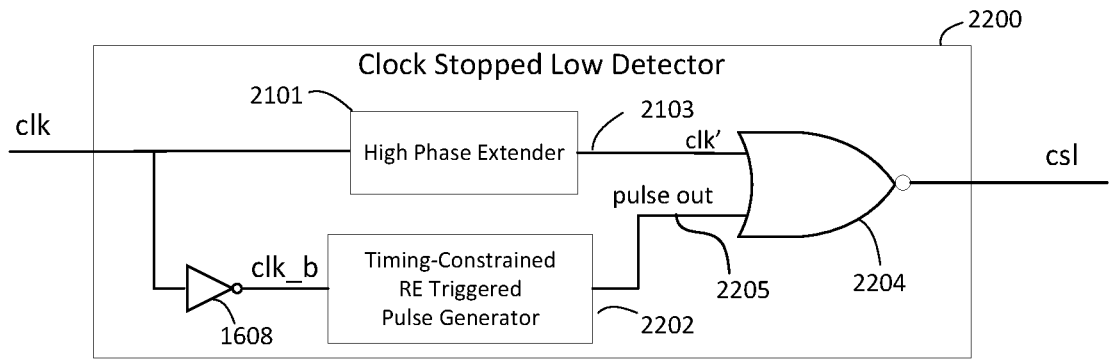

Two example embodiments that otherwise meet the timing constraints illustrated in FIG. 20 are shown in FIGS. 21 and 22. Clock stopped low detectors 2100 and 2200 are analogous to clock stopped low detectors 1400 and 1600, respectively, with the following differences. First, in each of embodiments 2100 and 2200, high phase extender circuitry 2101 is added. Second, each of the edge triggered pulse generators 2102, 2202 is designed to generate a pulse that, under all expected operating conditions for the clock anomaly detector circuitry, has a duration that is at least as long as a normally expected low phase duration of the clock signal, but not longer than a normally expected cycle time of the clock signal. Thus, the edge triggered pulse generators are "timing constrained." In both embodiments, an input of the high phase extender circuitry is coupled to the clock signal input, and a phase extender output 2103 is coupled to the top input of the NOR gate (2104, 2204). Accordingly, both embodiments function in the manner illustrated by the timing diagram of FIG. 23. As can be seen in the timing diagram, output pulse 2300 is generated responsive to falling edge 2302 of the clock signal, but the phase extender output (clk') remains high for a time sufficiently long to allow the pulse to begin, as indicated by the bracket at 2303. Similarly, the termination of output pulse 2300 occurs later than does the termination of a normal low phase instance 2306 (see bracket 2307) but before the normally occurring next falling edge 2308 of the clock signal.

The embodiments of FIGS. 21-22 are effective to eliminate the above-described false assertions provided that they function as described under all expected operating conditions for the clock anomaly detector. Ensuring this is the case may, however, present certain challenges relating to so-called "PVT variation" in circuits. To explain this, the concept of PVT variation in circuits will now be described in further detail.

PVT Variation

The initialization "PVT" stands for the words process, voltage and temperature. The phase "PVT variation" refers to variation in any one or more of the corresponding three conditions for a circuit under consideration.

Process variation describes the reality that any one unit produced by a manufacturing process will exhibit some differences relative to other units that are produced by the same manufacturing process. For example, the physical dimensions of one or more transistors or other circuit elements in one copy of a semiconductor product may be slightly different than the dimensions of corresponding circuit elements in another copy of the same semiconductor product. These differences can have subtle effects on the operation of individual units. Process variations may cause switching circuitry in one unit to be slightly faster, for example, than corresponding switching circuitry in a similar unit operated under the same temperature and voltage conditions.

Voltage variation refers variations in the supply voltage that is applied to a given semiconductor unit during operation. For example, this phrase would refer to variations in the level of the $V_{dd}$ supply voltage illustrated in FIG. 1. Any given semiconductor product may perform differently at one supply voltage level than at another. It is common for circuit elements to exhibit faster switching, for example, when operating with a higher supply voltage than with a lower supply voltage.

Temperature variation refers to variations in the operating temperature of a semiconductor unit. Operating temperature for a semiconductor unit may vary based on a variety of factors including, for example, ambient air temperature, supply voltage, workload, and the presence or absence of thermal management solutions in a host system environment in which the semiconductor unit is operating. Operating temperature variations, like supply voltage variations, can cause the performance characteristics of any given semiconductor unit to vary.

In light of the above, most semiconductor products are designed to exhibit a predictable set of performance characteristics over a range of possible process, voltage and/or temperature operating points ("PVT operating points"). Accordingly, a given semiconductor product may be designed to exhibit a specified set of slowest timing characteristics at a slowest PVT operating point, and a specified set of fastest timing characteristics at a fastest PVT operating point. A system designer may use these specifications to create a successful solution around such a semiconductor product, provided the solution is designed to tolerate both the slowest and the fastest timing characteristics for the product, and provided the designed solution will cause the product to operate within a specified range of voltage and temperature conditions. Within such a specified range of voltage and temperature conditions, the semiconductor product may function at a "slower" or at a "faster" PVT operating point depending on the prevailing conditions at any given moment during operation. Correspondingly, the timing characteristics of the semiconductor product may vary between slower and faster timing characteristics as the prevailing conditions change.

Techniques for Accommodating PVT Variation in Embodiments

Techniques and example embodiments will be described in this and the following sections for ensuring that the timing constraints illustrated in FIG. 23 hold at all expected PVT operating points for an anomaly detector circuit.

Figure 24:
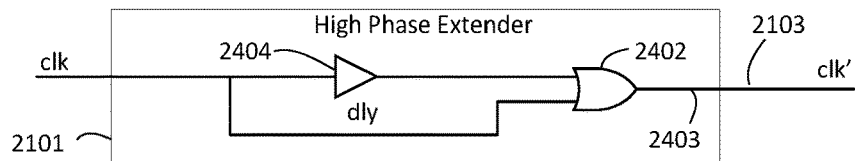
FIG. 24 is a schematic diagram illustrating an example implementation of a high phase extender in accordance with embodiments.
Figure 25:
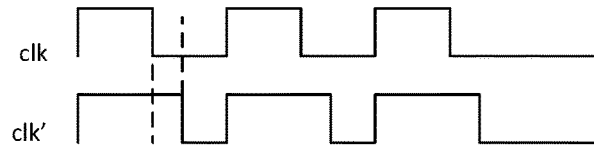
FIG. 25 is a timing diagram illustrating the operation of the high phase extender of FIG. 24.

FIG. 24 illustrates an example implementation of a high phase extender circuit 2101. In the example implementation, an OR gate 2402 drives a phase extender output 2403. The phase extender output, in turn, provides a phase extended version of the clock signal, labeled clk' in the drawing. The bottom input of the OR gate is coupled to the clock signal, while the top input of the OR gate is coupled to a delayed version of the clock signal. The delayed version of the clock signal is derived by sending the clock signal (labeled clk in the drawing) through a delay element 2404. The result is as shown in the timing diagram of FIG. 25. As can be seen in the timing diagram, the rising edges of clk' coincide with the rising edges of clk, but the falling edges of clk' are delayed relative to the falling edges of clk. Thus, each high phase instance of the clock signal is extended in clk' relative to the corresponding high phase instance in clk. The duration of the phase extension is equal to the amount of delay introduced by the delay element.

Figure 26:
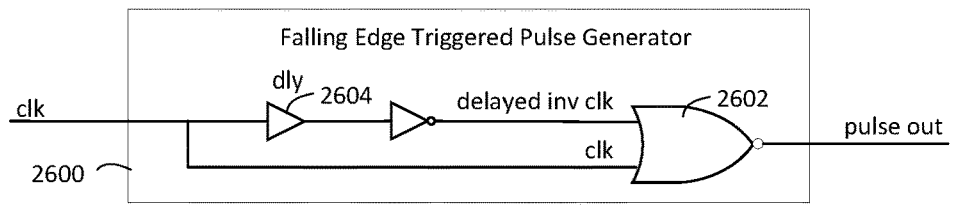
FIG. 26 is a schematic diagram illustrating an example implementation of a falling edge triggered pulse generator in accordance with embodiments.
Figure 27:
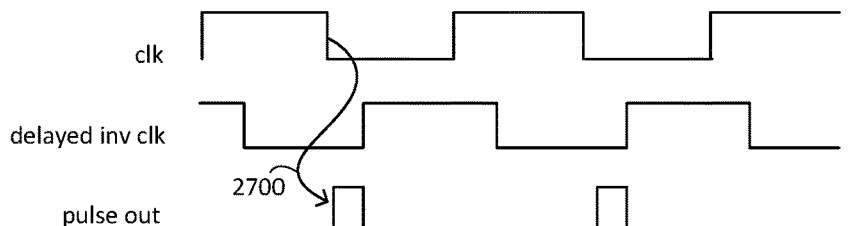
FIG. 27 is a timing diagram illustrating the operation of the falling edge triggered pulse generator of FIG. 26.

FIG. 26 illustrates an example implementation of a falling edge triggered pulse generator 2600. In the example implementation, a NOR gate 2602 drives the pulse output. The bottom input of the NOR gate is coupled to the clock signal (clk), while the top input of the NOR gate is coupled to an inverted and delayed version of the clock signal (delayed inv clk). The delay is provided by a delay element 2604. The result is as shown in the timing diagram of FIG. 27, in which each falling edge of clk produces a pulse having a duration that corresponds to the amount of delay introduced by the delay element, as indicated at 2700.

Figure 28:
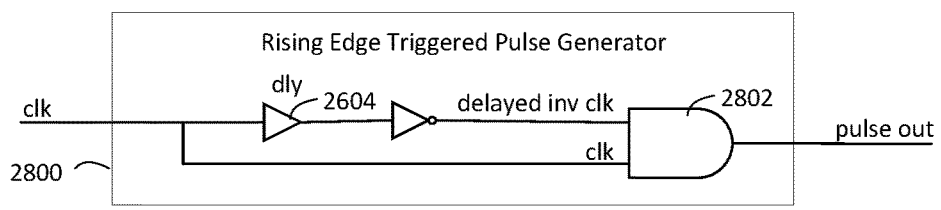
FIG. 28 is a schematic diagram illustrating an example implementation of a rising edge triggered pulse generator in accordance with embodiments.
Figure 29:
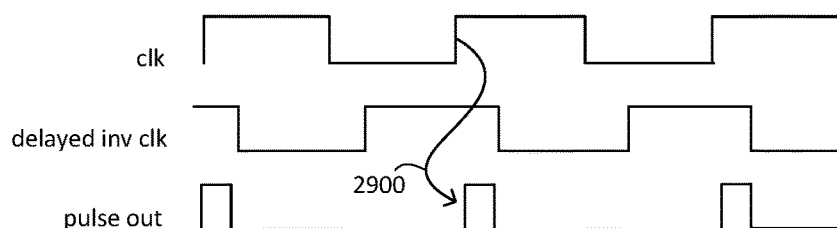
FIG. 29 is a timing diagram illustrating the operation of the rising edge triggered pulse generator of FIG. 28.

FIG. 28 illustrates an example implementation of a rising edge triggered pulse generator 2800. Pulse generator 2800 is identical to pulse generator 2600 except that, in pulse generator 2800, an AND gate drives the pulse output. The bottom input of the AND gate is coupled to the clock signal (clk), while the top input of the AND gate is coupled to an inverted and delayed version of the clock signal (delayed inv clk). As in the embodiment of FIG. 26, the delay is provided by a delay element 2604. The result is as shown in the timing diagram of FIG. 29, in which each rising edge of clk produces a pulse having a duration that corresponds to the amount of delay introduced by the delay element, as indicated at 2900.

Figure 23:
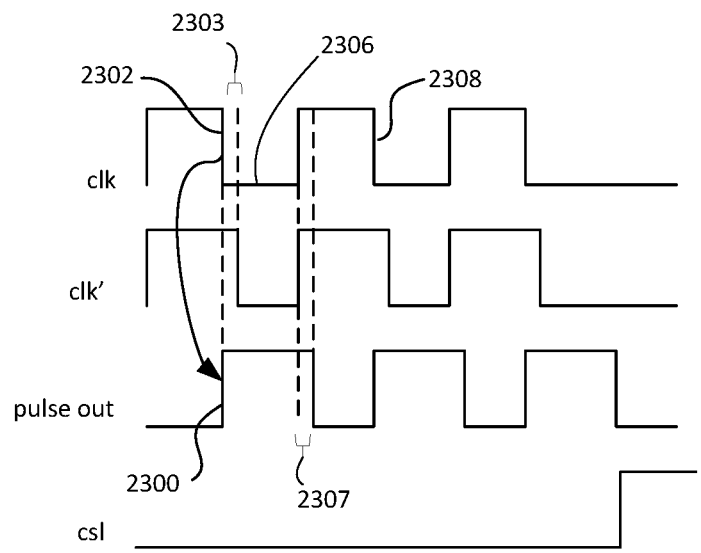
FIG. 23 is a timing diagram illustrating the operation of the embodiments of FIGS. 21 and 22.

In some embodiments an edge triggered pulse generator that exhibits the behaviors described in relation to FIG. 23 can be designed using one of the edge triggered pulse generators of FIG. 26 or 28, with a high phase extender 2101 applied to the output of the edge triggered pulse generator. During normal operation of the clock signal, the pulses so generated by either of generators 2600 or 2800 will not exceed the duration of a corresponding normal phase of the clock signal. This is so because the pulses generated by these embodiments are derived from the clock signal. With a high phase extender applied to the pulse output, however, the pulse may be extended such that the extended pulse duration exceeds that of a corresponding normal phase of the clock signal, in accordance with the example timing of FIG. 23. In other embodiments, other techniques may be used to design an edge triggered pulse generator having the behaviors described in relation to FIG. 23. One class of such techniques is to employ a cascade of unit pulses as will be further described below.

Cascaded Unit Pulses

Figure 30:
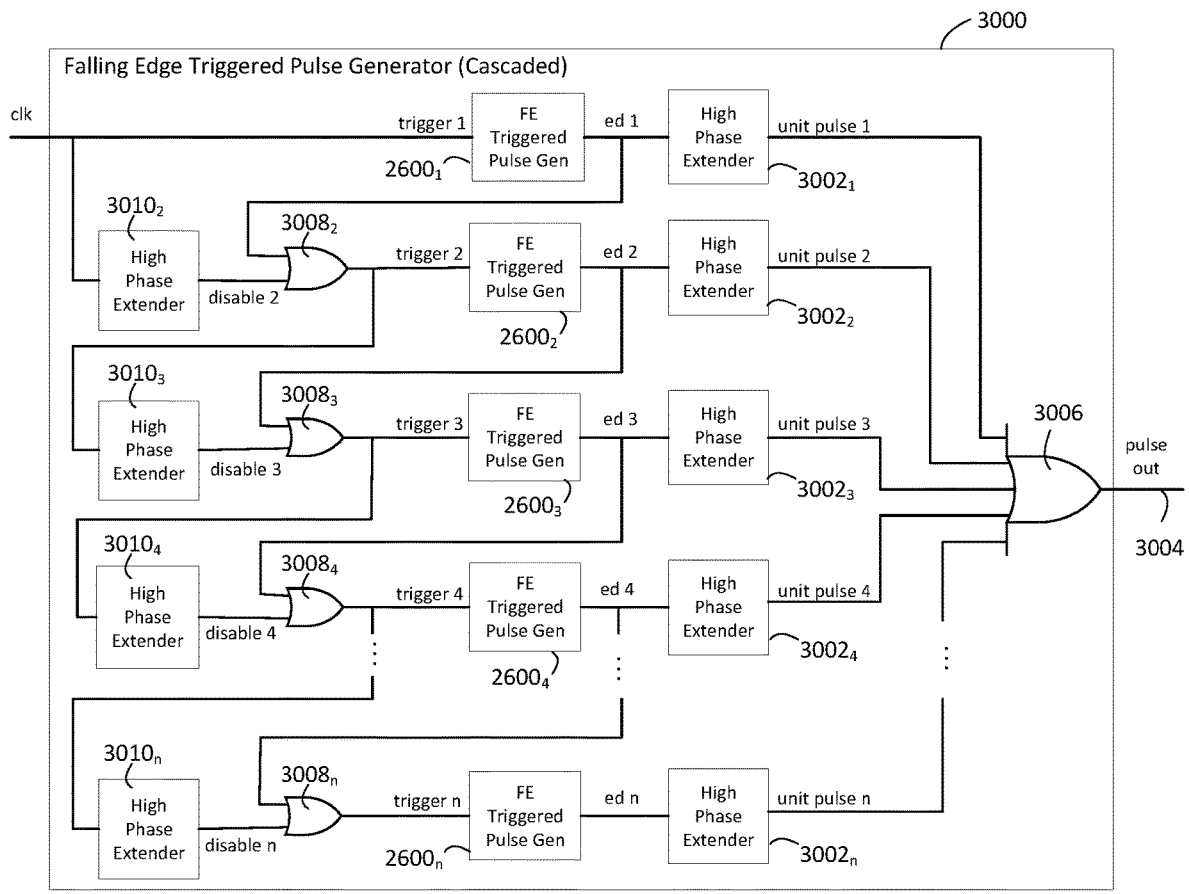
FIG. 30 is a block diagram illustrating an example falling edge triggered pulse generator implemented using cascaded unit pulses in accordance with embodiments.

In some embodiments, an edge triggered pulse generator may be implemented using a cascade of unit pulses as illustrated by the example of FIG. 30. In the example of FIG. 30, falling edge triggered pulse generator 3000 comprises a cascade of individual falling edge triggered unit pulse generators $2600_1$ to $2600_n$. Each of the cascaded unit pulse generators may be implemented, for example, in accordance with embodiment 2600 described above. Each unit pulse generator, when triggered, generates a corresponding edge detect pulse, labeled $ed_1$ to $ed_n$ in the drawing. Each edge detect pulse is coupled to a high phase extender, labeled $3002_1$ to $3002_n$ in the drawing, such that each high phase extender output represents a high phase extended version of a corresponding edge detect pulse. These high phase extended edge detect pulses are referred to herein as "unit pulses" because two or more of such pulses may be combined to create a longer pulse at the pulse output 3004 of the pulse generator. The outputs of high phase extenders 3002 constitute unit pulse outputs, labeled unit $pulse_1$ to unit $pulse_n$ in the drawing. Pulse composition circuitry 3006 is coupled between the unit pulse outputs and pulse output 3004 and is operable to generate an output pulse by composing signals derived from the unit pulse outputs. Provided that the unit pulses overlap one another in time, the pulse composition circuitry may be implemented as a logical NOR or a logical OR of the unit pulse outputs. Thus, a multi-input OR gate is shown in the illustrated embodiment, which provides an asserted-high pulse on output 3004. In other embodiments, other implementations may be used to implement either the unit pulses, or the unit pulse composition circuitry, or both. For example, a multi-input NOR gate may be used instead of a multi-input OR gate in systems for which an asserted-low signal on output 3004 is desired.

The trigger input for the first of the cascaded unit pulse generators is coupled directly to the clock signal. The trigger input for each of the other cascaded unit pulse generators is coupled to the output of a previous pulse generator in the cascade via one of the inputs of a corresponding two-input OR gate, labeled $3008_2$ to $3008_n$ in the drawing. The other input of each OR gate is coupled to the output of one of a cascaded series of high phase extenders labeled $3010_2$ to $3010_n$ in the drawing. The output of each OR gate constitutes a "trigger" output signal, which is provided as a trigger input to a corresponding one of pulse generators 2600. By virtue of OR gates 3008, the output of each high phase extender 3010 acts as a "disable" signal for a corresponding one of the cascaded edge triggered pulse generators, as shown. Each disable signal prevents the associated unit pulse generator from triggering for as long as the disable signal is asserted. This is so because a high state of a disable signal at one input of an OR gate prevents the associated pulse generator from seeing any falling edge that might occur at the other input of the OR gate.

The input of the first high phase extender 3010 is coupled directly to the clock signal. The inputs for each of the others is coupled to an output of a previous high phase extender, in daisy chain fashion, via OR gates 3008. Upon the occurrence of a rising edge of the clock signal and throughout the high clock phase instance that follows, all of the disable signals will be asserted by virtue of their daisy chained coupling to the clock signal. Upon the occurrence of a falling edge of the clock signal, however, and throughout the low clock phase instance that follows, the disable signals will sequentially become un-asserted, starting with disable$_2$, followed by disable$_3$, and so on until the next rising edge of the clock signal occurs. Provided that edge detect pulse ed$_1$ is longer than the delay associated with high phase extender 3010$_2$, unit pulse generator 2600$_2$ will trigger on the falling edge of ed$_1$. Similarly, provided that pulse ed$_2$ is longer than the delay associated with high phase extender 3010$_3$, unit pulse generator 2600$_3$ will trigger on the falling edge of ed$_2$, and so on through the cascade.

Figure 31:
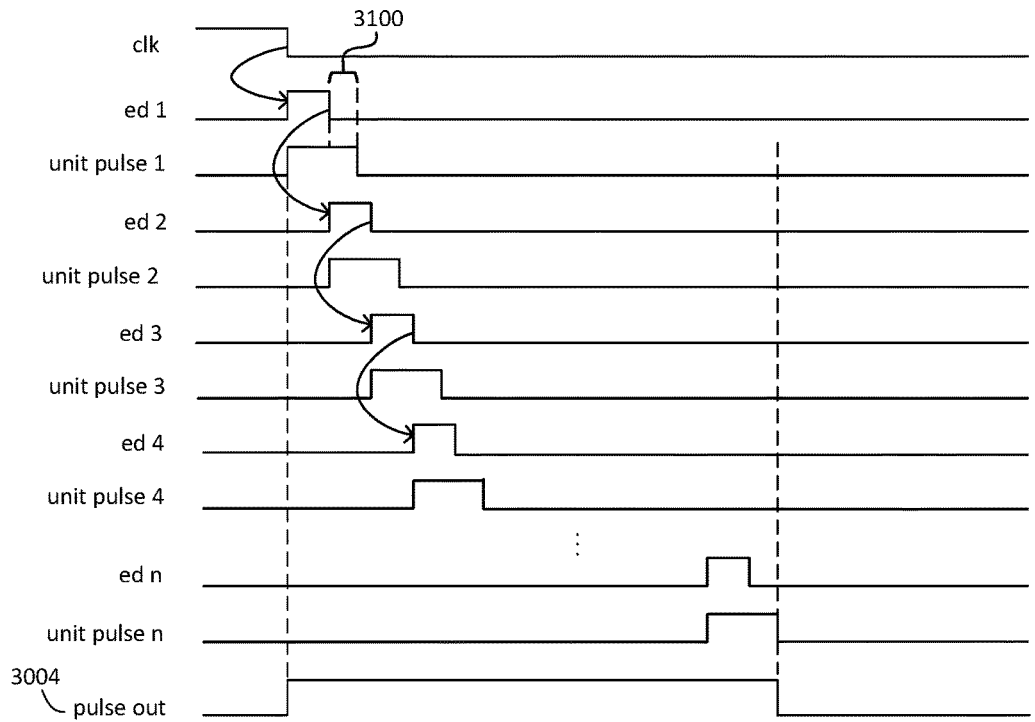
FIG. 31 is a timing diagram illustrating the operation of the falling edge triggered pulse generator of FIG. 30.

Referring now to the timing diagram of FIG. 31, the delays associated with each of high phase extenders 3002 may be chosen to ensure that the corresponding unit pulse will remain high at least until the following unit pulse begins, as indicated by bracket 3100 in the timing diagram. In this manner, the unit pulses will overlap one another at the inputs of OR gate 3006. The result is that pulse out signal 3004, shown at the bottom of the timing diagram, is continuously asserted while the cascade of unit pulses remains in progress. Pulse output 3004 therefore represent a "composition" of the individual overlapping unit pulse outputs.

"Truncation" of an output pulse, as the term is used herein, refers to terminating a pulse based on the occurrence of some condition rather than allowing the pulse to terminate in accordance with its designed maximum duration. In the example of FIGS. 30 and 31, the designed maximum duration of output pulse 3004 corresponds to the composed durations of each of unit pulses 1-$n$. Thus, if a falling edge occurs on the clock signal and the clock signal remains low indefinitely, each of the unit pulses in the cascade will fire, and the output pulse will last for its designed maximum duration. On the other hand, if a rising edge should occur on the clock signal while the cascade of unit pulses is still proceeding, then the duration of the output pulse will have been "truncated" because all of the disable signals will become asserted in response to the rising edge. In such a circumstance, the assertion of the disable signals effectively interrupts the cascade of unit pulses before it completes, resulting in an output pulse whose duration is shorter than its designed maximum duration.

Embodiments such as embodiment 3000 may be used to ensure the timing constraints of FIG. 23 over an entire expected range of PVT operating points for a clock anomaly detector circuit as follows. The maximum duration of output pulse 3004 will vary depending on the speed at which the pulse generator operates. And, for the reasons describe above, the speed at which the pulse generator operates will vary based on the PVT operating point of the pulse generator at any given moment. The pulse duration will be shorter at a fastest specified PVT operating point of the pulse generator than it will be at a slower PVT operating point of the pulse generator. To take this PVT variation into account, the number of unit edge triggered pulse generators in the cascade may be chosen such that the duration of the composite output pulse, if not truncated, will be longer than (or at least as long as) the expected normal duration of a low clock phase even at the fastest specified PVT operating point for the anomaly detector circuit. This will ensure that false assertions 1800 are eliminated. Moreover, although the maximum output pulse duration will be longer at slower PVT operating points, the actual pulse duration will not exceed the duration of a normal low clock phase instance. This is so because the occurrence of the next rising edge of the clock effectively truncates the composite output pulse if the cascade of unit pulses is still in progress at the time of the rising edge, as desired. Thus, the timing constraints of FIGS. 20 and 23 are fulfilled at all expected PVT operating points.

Even in embodiments that do not implement the output pulse as a composition of unit pulses as does the embodiment of FIG. 30, the technique of truncating an output pulse responsive to sensing the start of a next clock phase instance (or, equivalently, the end of a current clock phase instance) may still be employed in the manner described above to take expected PVT variations of the detector circuit into account.

Dynamic Calibration

Any of the techniques and embodiments described above may be employed to ensure correct functionality over an expected range of PVT operating points for an anomaly detection circuit. Despite this, each of the above embodiments, without more, may exhibit latency before detecting an anomaly. In particular, each of the above embodiments may under certain conditions exhibit the latency indicated by bracket 2015 in FIG. 20. Consider, for example, an anomaly detector in which the output pulse (e.g., any of output pulses 1406, 1606, 2105, 2205) has a designed maximum duration that is substantially equal to an expected normal clock phase duration at the fastest expected PVT operating point for the anomaly detector. Such an anomaly detector may exhibit minimal detection latency 2015 when the detector is in fact operating at the fastest expected PVT operating point. When the same detector is operating at slower PVT operating points, however, detection latency 2015 will increase. For reasons explained above, such latency is undesirable.

A further class of techniques and embodiments will now be described that may be employed to greatly reduce detection latency 2015. These techniques and embodiments use what is referred to herein as "dynamic calibration." Dynamic calibration refers to the technique of adjusting the maximum duration of an output pulse (such as any of output pulses 1406, 1606, 2105, 2205) responsive to the current PVT operating point of a given anomaly detection circuit. That is, when dynamic calibration is employed, the maximum duration of the output pulse is adjusted while the anomaly detection circuit is in operation. The above-described technique of output pulse truncation may still be employed in anomaly detection circuits that use dynamic calibration, but in any of such detectors, the duration of a non-truncated output pulse (i.e. the maximum duration of the output pulse) may vary during operation of the detector as a result of the dynamic calibration process.

When the non-truncated output pulse duration of a detector is dynamically calibrated so that its duration corresponds closely to the duration of a normal clock phase instance, detection latency 2015 will be commensurately reduced at any PVT operating point within the range of expected PVT operating points for the anomaly detection circuit.

Figure 32:
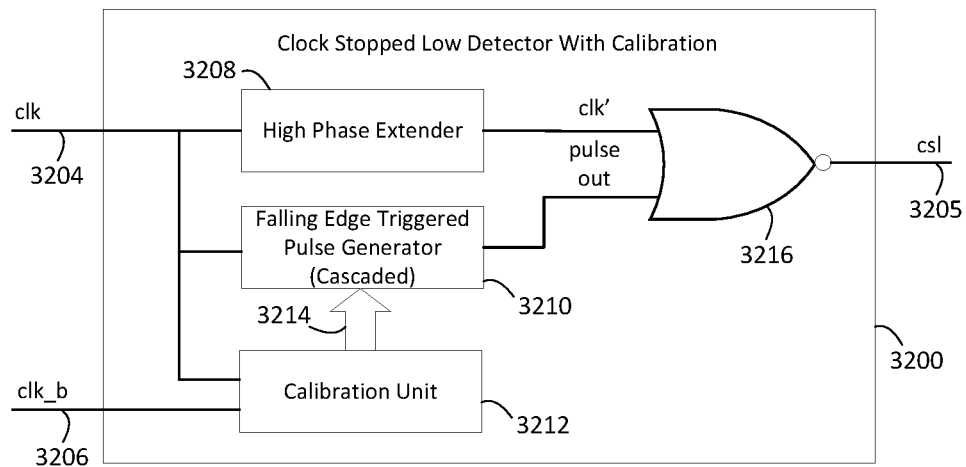
FIG. 32 is a block diagram illustrating an example clock stopped low detector with dynamic calibration in accordance with embodiments.
Figure 33:
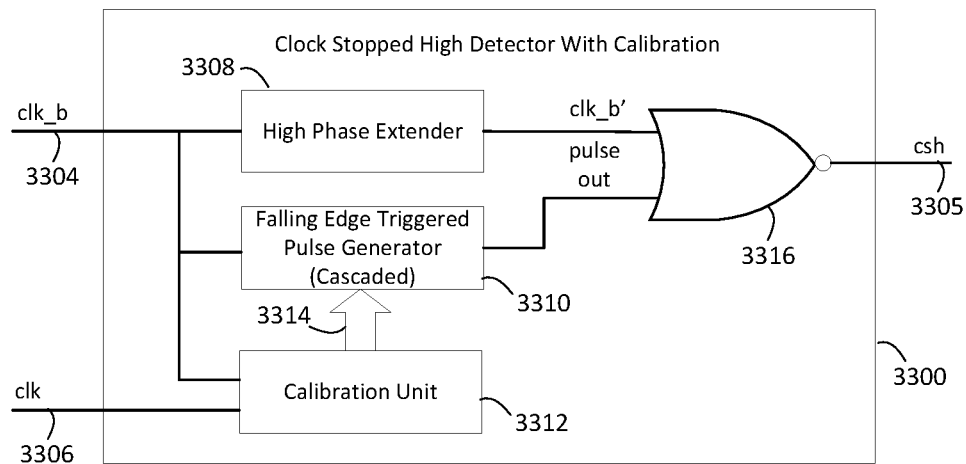
FIG. 33 is a block diagram illustrating an example clock stopped high detector with dynamic calibration in accordance with embodiments.

FIGS. 32 and 33 illustrate two example clock stopped detection circuits that employ dynamic calibration in accordance with embodiments. Circuit 3200 functions as a clock stopped low detector. Circuit 3300 functions as a clock stopped high detector. Each has an input for sensing either the clock signal (clk), or an inverse of the clock signal (clk_b), or both. For example, in the illustrated embodiments, circuit 3200 has a clk input 3204 and a clk_b input 3206. Circuit 3300 has a clk input 3304 and a clk_b input 3306. In other embodiments, each of the circuits may have a single input for sensing clk or clk_b and may invert the signal internally as needed. Each circuit has an output 3205, 3305. When asserted, the output indicates that a clock anomaly has been detected.

Each embodiment includes a high phase extender 3208, 3308, an edge triggered pulse generator 3210, 3310, and a calibration unit 3212, 3312. In the illustrated embodiments, each of the high phase extenders and the edge triggered pulse generators is coupled either to clk or to clk_b, as shown, while each of the calibration units is coupled to both of clk and clk_b. The high phase extenders and the edge triggered pulse generators may be implemented in accordance with any of the examples described above. In some embodiments, the high phase extenders may be implemented in accordance with high phase extender 2101, and each of the edge triggered pulse generators may be implemented in accordance with edge triggered pulse generator 3000. In other embodiments, other implementations may be used. Example implementations for the calibration units will be further described below.

In each of embodiments 3200, 3300, the calibration units are operable to measure the duration of a first clock phase instance. For example, calibration unit 3212 is operable to measure the duration of a high phase instance of the clock signal, while calibration unit 3312 is operable to measure the duration of a low phase instance of the clock signal. (Depending on the context, either of the high or the low phase instances may be referred to as a "first" phase instance.)

Meanwhile, in each of embodiments 3200, 3300, the high phase extenders and the edge triggered pulse generators are operable to monitor the duration of a second clock phase instance. For example, high phase extender 3208 and edge triggered pulse generator 3210 are operable to monitor the duration of a low phase instance of the clock signal, while high phase extender 3308 and edge triggered pulse generator 3310 are operable to monitor the duration of a high phase instance of the clock signal. (Depending on the context, either of the low or the high phase instances may be referred to as a "second" phase instance.)

The calibration units are coupled to the edge triggered pulse generators as shown at 3214, 3314, and Boolean logic circuits 3216, 3316 are coupled to the outputs of the high phase extenders and the edge triggered pulse generators, also as shown. By virtue of these couplings, each of the detector circuits is operable to assert its respective output 3205, 3305 if the monitored duration of a second clock phase instance has exceeded the measured duration of a first clock phase instance.

In the illustrated embodiments, the first clock phase instance is an opposite state clock phase relative to the second clock phase instance, and the second clock phase instance immediately follows the first clock phase instance. The first and second clock phase instances therefore constitute one cycle of the clock signal. Thus, the illustrated embodiments are suitable for use when the clock signal exhibits a 50% duty cycle such that the expected duration of each low phase is the same as the expected duration of each high phase.

In other embodiments, the first and second clock phase instances may correspond to separate instances of the same clock phase occurring in different cycles of the clock. The latter embodiments are suitable for use when the clock signal normally exhibits other than a 50% duty cycle. A variety of different embodiments are also possible. For example, in some embodiments the first and second clock phase instances may correspond to opposite state clock phase instances occurring in different cycles of the clock.

In some embodiments the measuring and monitoring functions described above may be performed in every cycle of the clock signal, while in other embodiments the measuring and monitoring functions may be performed periodically but not in every cycle of the clock signal.

In the embodiment of FIG. 32, the high phase extender functions to generate a phase extended version of the clock signal in which a first clock phase instance is lengthened, and the edge triggered pulse generator functions to generate a timing pulse responsive to the start of a second clock phase instance. The calibration unit functions to control the maximum duration of the timing pulse based on the measured duration of the first clock phase instance. In the illustrated embodiment, the output of the detector comprises the logical NOR of the timing pulse and the phase extended version of the clock signal. In other embodiments, the output may comprise the logical OR of the same to signals. When the calibration unit causes the duration of the timing pulse to be substantially equal to the duration of the first clock phase instance, the detection latency indicated by bracket 2015 is minimized.

The internal implementations of each of clock stopped detectors 3200, 3300 may be substantially identical except that, by reversing the clk and clk_b inputs to the respective detectors, one detector becomes operable to measure and monitor phase instances whose states are opposite to those that are measured and monitored by the other detector. That is, with clk and clk_b reversed as in the illustrated embodiments, one detector measures a low phase instance and monitors a high phase instance, while the other detector measures a high phase instance and monitors a low phase instance. Thus, because the clk and clk_b inputs are reversed as between the two detectors illustrated, detector 3300 is operable to measure and monitor different phase instances than is detector 3200.

Figure 34:
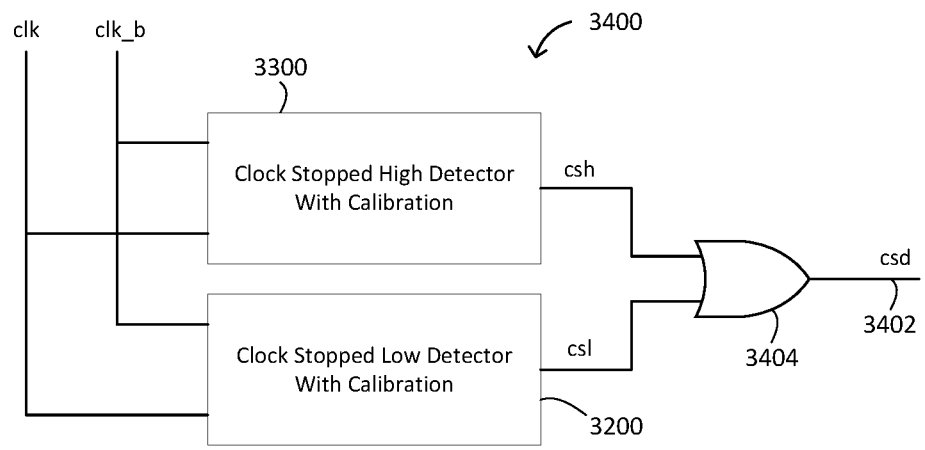
FIG. 34 is a block diagram illustrating an example clock stop detection system with dynamic calibration, implemented using the detectors of FIGS. 32 and 33 in accordance with embodiments.

FIG. 34 illustrates an example embodiment that includes one of each of the clock stopped detectors of FIGS. 32 and 33. Anomaly detection circuit 3400 includes a clock stopped high detector with calibration, 3300, and a clock stopped low detector with calibration, 3200, as shown. Circuit 3400 provides a clock stopped detection output 3402. The state of the clock stopped detection output may be based on the outputs of the two clock stopped detector circuits. In the illustrated embodiment, the clock stopped detection output comprises the logical OR of the respective outputs of the clock stopped detectors, csh and csl, as shown at 3404. In other embodiments the clock stopped detection output may comprise the logical NOR of the two outputs.

In further embodiments, a reset circuit such as reset unit 204 may be coupled to the clock stopped detection output of FIG. 34 so as to assert reset inputs of one or more subsystems of a host system responsive to an assertion of the clock stopped detection output.

Example Calibration Unit

Figure 35:
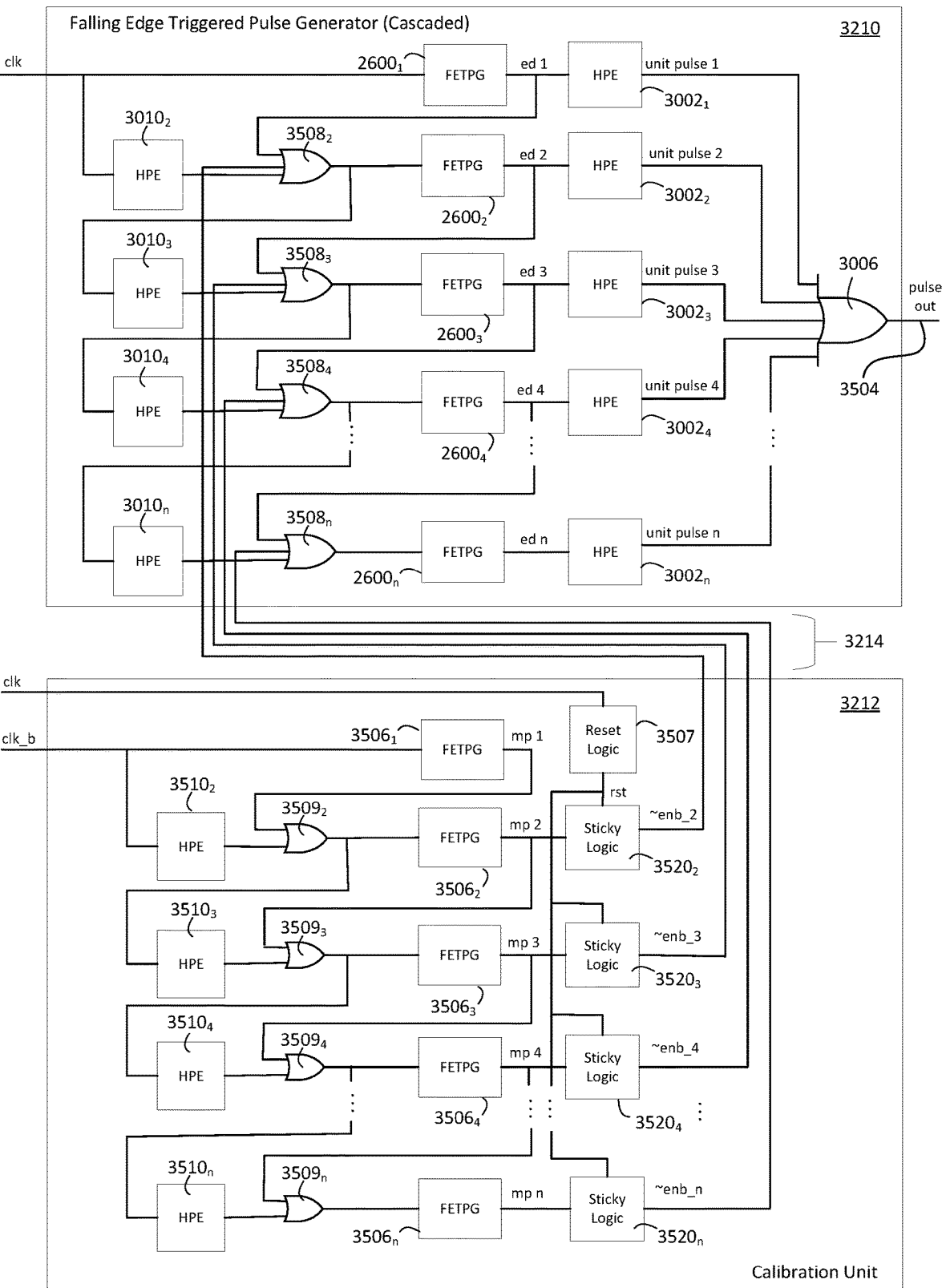
FIG. 35 is a block diagram illustrating an example implementation of the falling edge triggered pulse generator and the calibration unit of FIG. 32 in accordance with embodiments.

FIG. 35 illustrates an example implementation of the falling edge triggered pulse generator and the calibration unit of FIG. 32. Consistent with the description given in the preceding paragraph, the falling edge triggered pulse generator and the calibration unit of FIG. 33 may be implemented in a manner identical to the embodiment shown in FIG. 35 except with the clk and clk_b inputs reversed. In the illustrated embodiment, pulse generator 3210 functions as a monitoring unit, while circuitry 3212 functions as a calibration unit.

Pulse generator 3210 may be identical to pulse generator 3000 illustrated in FIG. 30 except that each of two-input OR gates 3008 in the embodiment of FIG. 30 is replaced with a three-input OR gate 3508 in the embodiment of FIG. 35, as shown. The third input of each three-input OR gate is coupled to a corresponding asserted-low enable signal provided by the calibration unit. The asserted-low enable signals are labeled ~enb_2 to ~enb_n in the drawing. Recall from the discussion of pulse generator 3000 that the outputs of high phase extenders 3010 constitute "disable" signals in the sense that, when high, each disable signal prevents a corresponding one of edge triggered pulse generators 2600 from firing. Each of the asserted low enable signals ~enb_2 to ~enb_n functions in the same manner. That is, when a given ~enb signal is low, the corresponding edge triggered unit pulse generator 2600 is enabled because the pulse generator will be able to see a falling edge appearing at the top input of the associated OR gate 3508. When the same ~enb signal is high, however, the corresponding edge triggered unit pulse generator 2600 is disabled because the high state of the ~enb signal prevents the unit pulse generator from seeing a falling edge appearing at the top input of the associated OR gate 3508.

Calibration unit 3212 is operable to measure the duration of a high clock phase instance by initiating a cascade of unit measurement pulses, mp 1 to mp n, responsive to the start of the high clock phase instance and by interrupting the cascade of unit measurement pulses responsive the end of the high clock phase instance. OR gates 3509 function in the same manner as do OR gates 3008 in FIG. 30, falling edge triggered pulse generators 3506 function in the same manner as do pulse generators 2600 in FIG. 30, and high phase extenders 3510 function in the same manner as do high phase extenders 3010 in FIG. 30. Each time one of the cascading unit measurement pulses appears on the output of a pulse generator 3506, the output of a corresponding sticky logic unit 3520 transitions from an un-asserted state to an asserted state. (In the illustrated embodiment, the sticky logic outputs follow the asserted-low design convention.) Thus, each of the enable signals ~enb_2 to ~enb_n is driven by an output of a correspond one of the sticky logic units. By virtue of this arrangement, the number of sticky logic units whose outputs are asserted when the cascade of unit measurement pulses is interrupted indicates the total number of unit measurement pulses that occurred during the pendency of the high clock phase instance. This total is referred to herein as an "accumulated" number of unit measurement pulses.

During any given monitoring phase, a timing pulse 3504 is generated by composing a cascade of unit timing pulses 3002 that are produced by those of the unit pulse generators 2600 that have been enabled by a previous measurement phase. As was described in the preceding paragraph, the number of unit pulse generators 2600 so enabled will correspond to the number of unit measurement pulses that were accumulated during the previous measurement phase.

At any PVT operating point of the anomaly detector, the timing of the calibration unit may be identical to the timing of the monitoring unit. This is so because each of the high phase extenders 3510 of the calibration unit may be identical or substantially identical to the high phase extenders 3010 of the monitoring unit, and each of the falling edge triggered unit pulse generators 3506 of the calibration unit may be identical or substantially identical to the falling edge triggered unit pulse generators 2600 of the monitoring unit. As was described above, only those of unit pulse generators 2600 that have been enabled by the calibration unit will fire when any given low clock phase instance is being monitored by the monitoring unit. Because the outputs of the sticky logic units determine which of the unit pulse generators 2600 are enabled, the maximum duration of the timing pulse 3504 used to monitor any low clock phase instance will correspond to the measured duration of the previous high phase instance, as desired. Moreover, by virtue of the dynamic calibration so established, and for the reasons described above, the anomaly detection latency of bracket 2015 will be minimized at every PVT operation point of the anomaly detector, also as desired.

Example Reset Logic and Example Sticky Logic

At the start of every high phase instance, reset logic 3507 asserts a reset signal that is coupled to each of the sticky logic units as shown. This reset signal causes each of the sticky logic units to transition to its un-asserted state so that the duration of the high phase instance may be measured.

Figure 36:
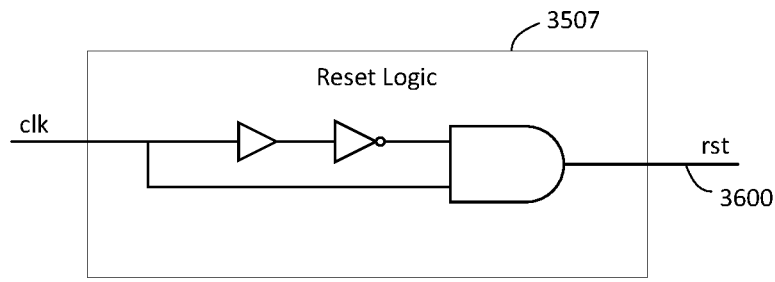
FIG. 36 is a schematic diagram illustrating an example implementation of the reset logic of FIG. 35.

FIG. 36 illustrates an example implementation of the reset logic unit 3507 of FIG. 35. As is apparent from the drawing, the unit may be implemented in the same manner as is the rising edge triggered pulse generator of FIG. 28 so that it will generate a pulse on reset output 3600 upon every rising edge of the clock signal (clk).

Figure 37:
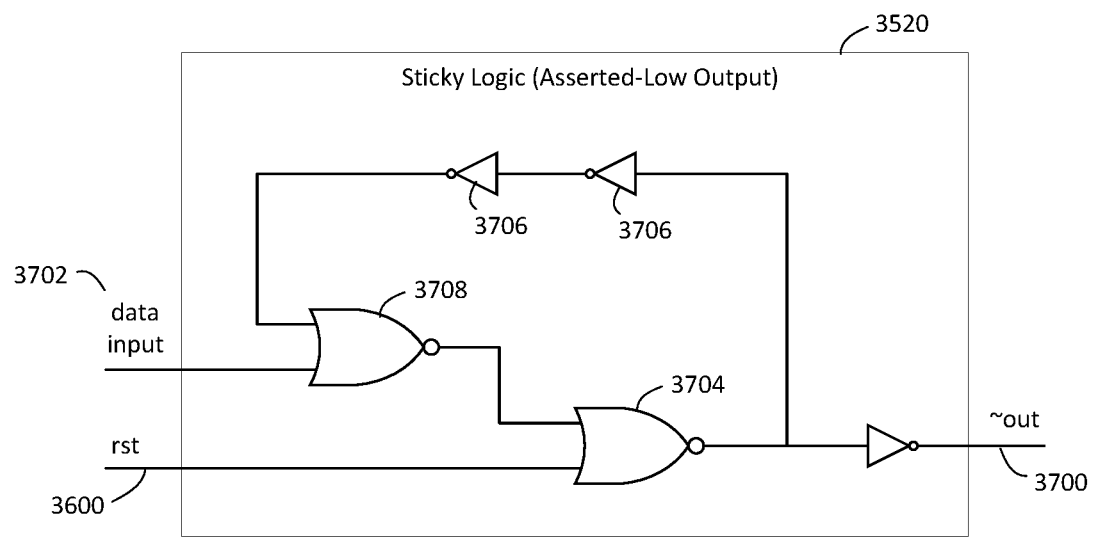
FIG. 37 is a schematic diagram illustrating an example implementation of the sticky logic of FIG. 35.

FIG. 37 illustrates an example implementation of the sticky logic units of FIG. 35. The data input 3702 of each sticky logic unit is coupled to the output of a corresponding one of falling edge triggered pulse generators 3506, while the reset input of each sticky logic unit is coupled to reset signal 3600. The pulse generated by reset logic 3507 should be long enough for the output of NOR gate 3704 to propagate through inverters 3706 and NOR gate 3708 so that both inputs of NOR gate 3704 will become low. The top input of NOR gate 3704 will become low at this time as well, because the trigger inputs for each of the falling edge triggered pulse generators 3506 are driven by clk_b. Thus, the measurement pulse outputs mp 2 to mp n will be low. After the reset pulse 3600 terminates, sticky logic output 3700 will remain un-asserted (high) until a rising edge occurs at the data input. After a rising edge occurs on the data input, output 3700 will transition to its asserted state (low) and will remain in that state until the next reset.

Example Methods Using Dynamic Calibration

Figure 38:
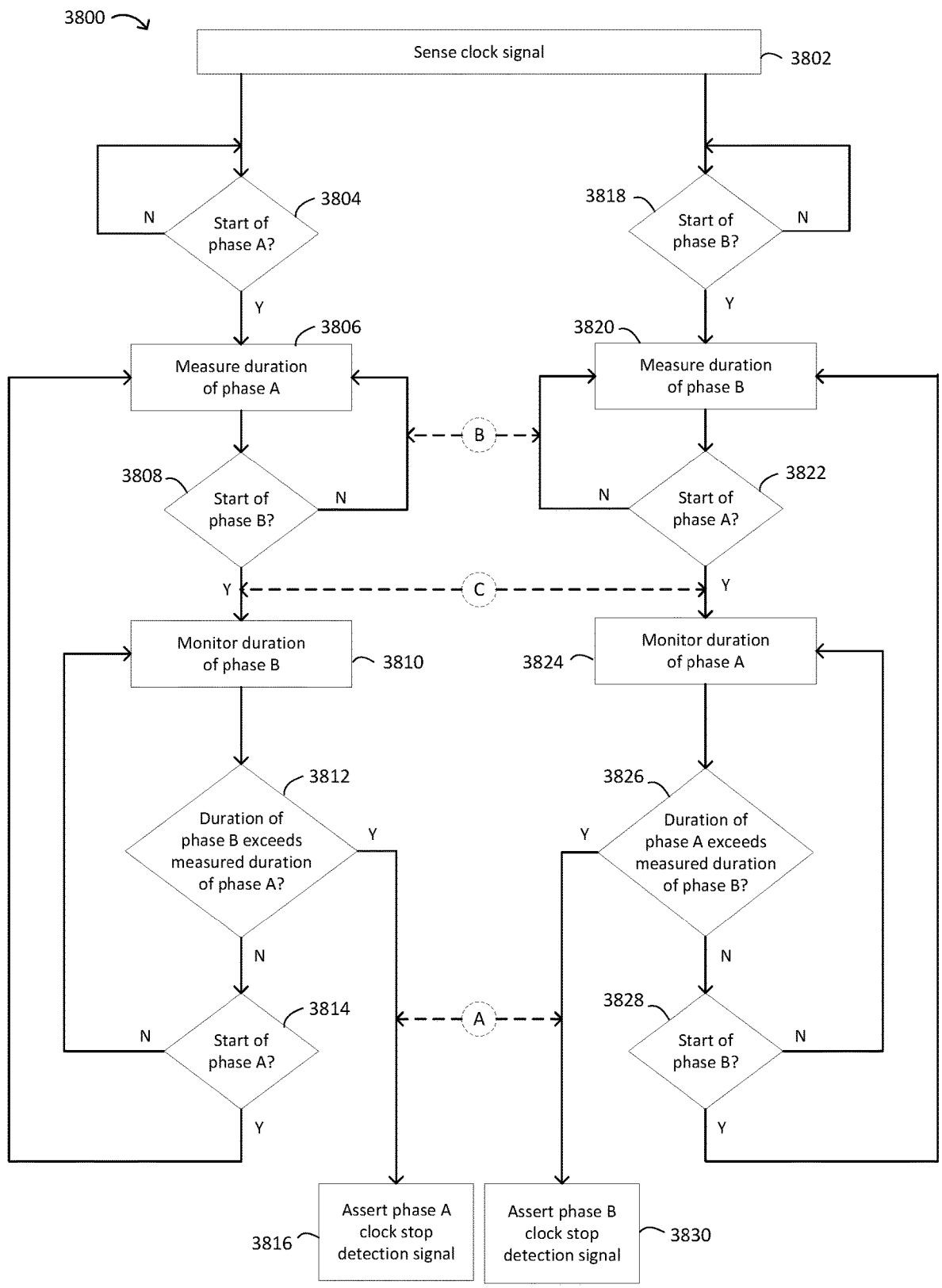
FIG. 38 is a flow diagram illustrating an example method for clock anomaly detection using dynamic calibration in accordance with embodiments.

FIG. 38 is a flow diagram illustrating a class of example methods for clock anomaly detection using dynamic calibration in accordance with embodiments. These methods may be implemented, for example, using one or more of the structures described above. Method 3800 begins, at step 3802, with sensing a clock signal such as any of those described above. At steps 3804 to 3808, a duration of a first phase of the clock signal is measured. At steps 3810 to 3814, the duration of a second phase is monitored. The start of the monitored phase occurs later than the start of the measured phase. At step 3812, a determination is made whether the duration of the monitored second phase has exceeded the measured duration of the first phase. If so, a first clock stop detection signal is asserted at step 3816. But if the end of the second phase is detected before its duration has exceeded the measured duration of the first phase (step 3814), then the method resumes at step 3806. In some embodiments, the measured first and the monitored second phase may be opposite state phases. In such embodiments, the second phase may immediately follow the first phase.

In some embodiments, the method may also include steps 3818 to 3830. In such embodiments, the duration of the second phase may be measured in steps 3818 to 3822, and the duration of a third phase may be monitored in steps 3824 to 3828. The start of the monitored third phase occurs later than the start of the measured second phase. At step 3826, a determination is made whether the duration of the monitored third phase has exceeded the measured duration of the second phase. If so, a second clock stop detection signal is asserted at step 3830. But if the end of the monitored third phase is detected before its duration has exceeded the measured duration of the second phase (step 3828), then the method resumes at step 3820. In some embodiments, the measured second and the monitored third phase may be opposite state phases. In such embodiments, the third phase may immediately follow the second phase.

Figure 39:
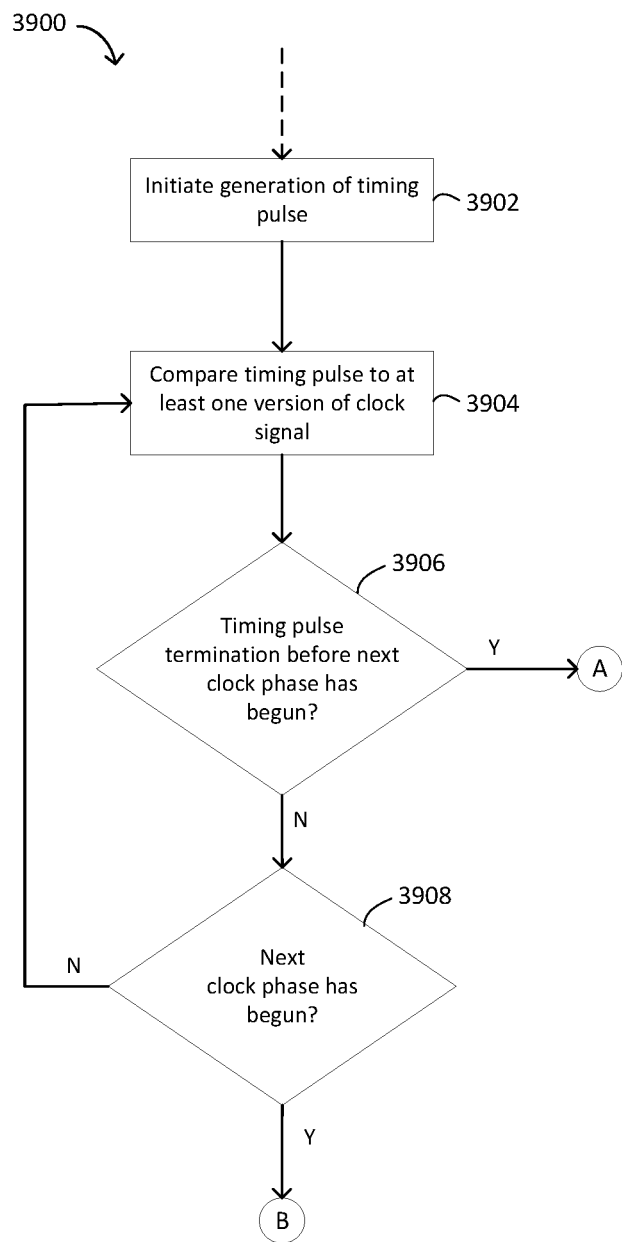
FIG. 39 is a flow diagram illustrating an example implementation of the monitoring steps of FIG. 38 in accordance with embodiments.

In some embodiments, either monitoring step sequence 3810 to 3814, or monitoring step sequence 3824 to 3828, or both monitoring step sequences, may be implemented in the manner illustrated at 3900 in FIG. 39. At step 3902, monitoring the duration of a phase is begun by initiating the generation of a timing pulse. The timing pulse may have a duration that is based on the measured duration of a previously occurring phase. At step 3904, the state of the timing pulse is compared to one or more of the clock signal, an inverse of the clock signal, a phase extended version of the clock signal, or a phase extended version of the inverse of the clock signal. At step 3906, a determination is made whether the timing pulse has terminated before the next phase of the clock signal has begun. If so, the method may assert a clock stop detection signal at steps 3816 or 3830 (see path A). But if the next phase of the clock signal begins before the timing pulse has terminated (step 3908), then the method may resume at either of steps 3806 or 3820 as appropriate (see path B).

Figure 40:
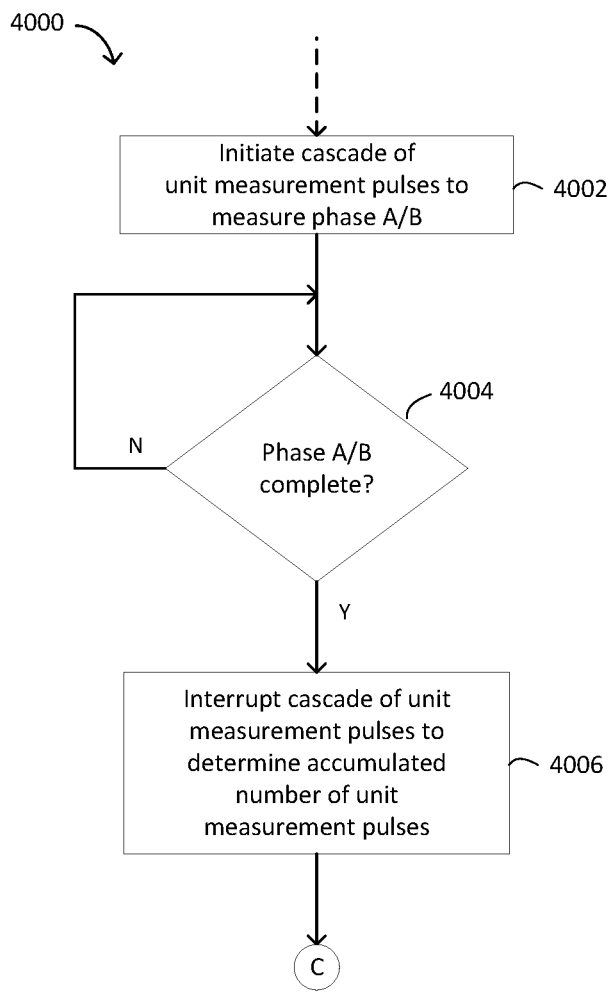
FIG. 40 is a flow diagram illustrating an example implementation of the measuring steps of FIG. 38 in accordance with embodiments.

In any of the above embodiments, measuring step sequence 3804 to 3808, or measuring step sequence 3818 to 3822, or both measuring step sequences, may be implemented in the manner illustrated at 4000 in FIG. 40. At step 4002, measuring the duration of a phase is begun by initiating a cascade of unit measurement pulses. In step 4004 the cascade of unit measurement pulses is allowed to proceed until the end of the phase is detected. When the end of the phase is detected, the cascade of unit measurement pulses is interrupted at step 4006, thus determining an accumulated number of unit measurement pulses that have occurred as of the time of the interruption.

Figure 41:
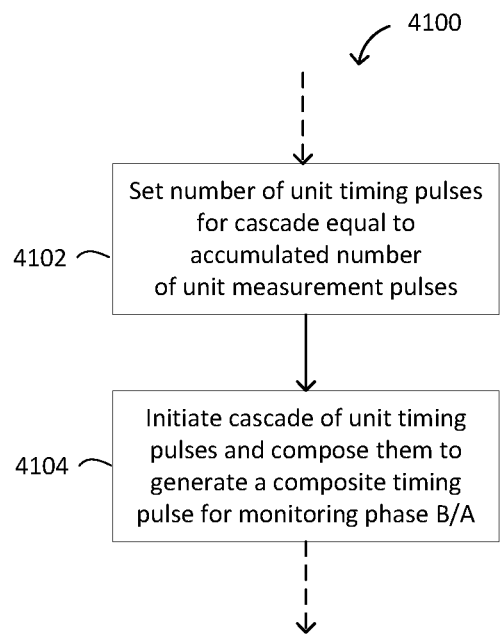
FIG. 41 is a flow diagram illustrating an example step sequence for generating a timing pulse in accordance with embodiments.

In such embodiments, either of the above-described monitoring step sequences may include sequence 4100 illustrated in FIG. 41. In sequence 4100, a number of unit timing pulses to be included in a unit timing pulse cascade is set equal, at step 4102, to the number of accumulated unit measurement pulses that was determined in step 4006. At step 4104, the monitoring phase begins by initiating the cascade of unit timing pulses. The cascading unit timing pulses are composed to generate a composite timing pulse that is used to monitor the duration of the current phase.

Detectable Anomalies

All of the anomaly detector embodiments described above are capable of detecting a clock stopped condition, as has been explained.

It should also be noted that all of the anomaly detector embodiments described above are capable of detecting an over-voltage condition in the supply voltage $V_{dd}$. Such a condition may be detected as a clock anomaly, for example, if the supply voltage is increased beyond the range of the PVT operating points within which the anomaly detector was designed to function. When such an over-voltage condition occurs, the frequency of the clock signal itself, and thus the expected durations of the corresponding clock phases, will not change. This is because the frequency of the clock signal is determined by a crystal reference as was described above in relation to crystal clock circuitry 202. The timing exhibited by the anomaly detection circuitry, however, will become faster in response to the increase in $V_{dd}$. Thus, in anomaly detector embodiments for which the maximum duration of the timing pulse has been designed to correspond to the fastest expected PVT operating point of the detector, operation at a faster-than-expected PVT operating point will cause the timing pulse to be shorter than a corresponding phase of the clock signal. The anomaly detector will therefore assert its output under such conditions, which will effectively flag the over-voltage condition as a clock anomaly.

It should further be noted that all of the anomaly detector embodiments described above that employ dynamic calibration are capable of detecting a clock "glitch" anomaly (i.e., a condition in which the clock signal abruptly and temporarily exhibits a duty cycle other than the expected duty cycle). In a system in which the clock signal is expected to exhibit a 50% duty cycle, for example, such a glitch will cause one phase instance of the clock signal have a longer duration than the previous phase instance of the clock signal. By virtue of the dynamic calibration process described above, the monitored duration of the longer phase instance will exceed the measured duration of the shorter phase instance, which will cause the anomaly detector to assert its output. Thus, the clock glitch will be detected and flagged, as desired.

Example Implementations of Boolean Logic Circuits

In any of the embodiments describe above, the various Boolean logic circuits may be implemented according to any of a variety of conventional techniques. FIGS. 42 to 45 illustrate several such techniques by way of example and not by way of limitation.

Figure 42:
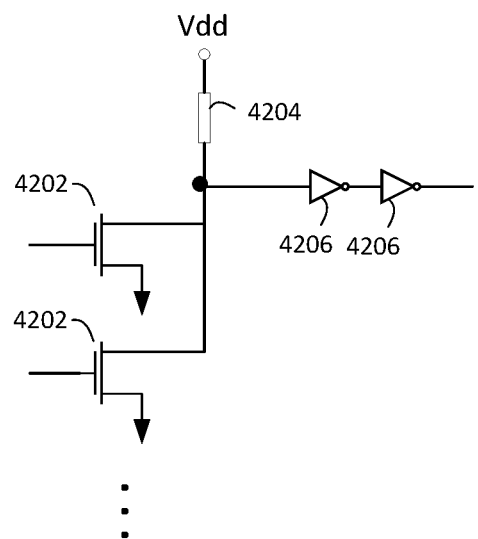
FIG. 42 is a schematic diagram illustrating an example class of NOR gates implemented using NFETs and a pull-up resistor, suitable for use in some embodiments.

FIG. 42 illustrates a multi-input NOR gate implemented using n-type field effect transistors ("NFETs") 4202 and a pull-up resistor 4204. Inverter elements 4206 may be provided in such embodiments as output drivers.

Figure 43:
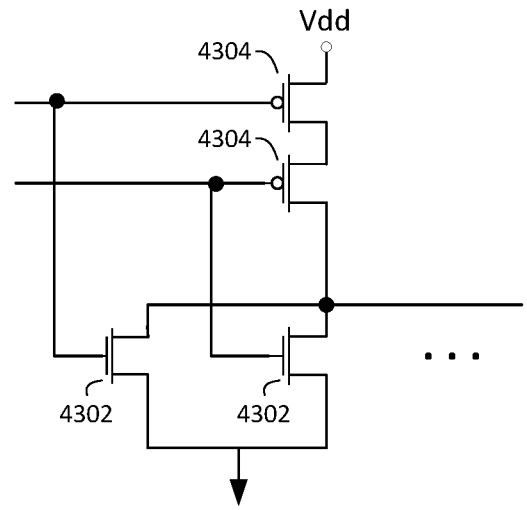
FIG. 43 is a schematic diagram illustrating an example class of NOR gates implemented using PFETs and NFETs without a pull-up resistor, suitable for use in some embodiments.

FIG. 43 illustrates the same multi-input NOR gate implemented using only NFETs 4302 and p-type field effect transistors ("PFETs") 4304, with no pull-up resistor.

Figure 44:
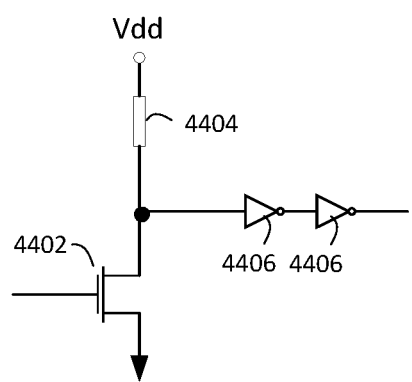
FIG. 44 is a schematic diagram illustrating an example class of inverters implemented using an NFET and a pull-up resistor, suitable for use in some embodiments.

FIG. 44 illustrates an inverter element implemented using an NFET 4402 and a pull-up resistor 4404. As in the NOR gate implementation of FIG. 42, inverter elements 4406 may be provided in such embodiments as output drivers.

Figure 45:
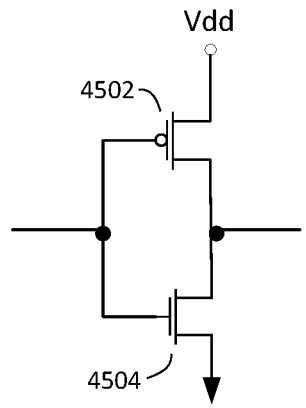
FIG. 45 is a schematic diagram illustrating an example class of inverters implemented using PFETs and NFETs without a pull-up resistor, suitable for use in some embodiments.

FIG. 45 illustrates the same inverter element implemented using only a PFET 4502 and an NFET 4504 with no pull-up resistor.

Many such variations are possible. Thus, persons having skill in the art will readily appreciate that embodiments in accordance with those described above may make use of these and other conventional building block elements, either alone or in combination, as well as others.

Conclusion

Multiple specific embodiments have been described above and in the appended claims. Such embodiments have been provided by way of example and illustration. Persons having skill in the art and having reference to this disclosure will perceive various utilitarian combinations, modifications and generalizations of the features and characteristics of the embodiments so described. For example, steps in methods described herein may generally be performed in any order, and some steps may be omitted, while other steps may be added, except where the context clearly indicates otherwise. Similarly, components in structures described herein may be arranged in different positions or locations, and some components may be omitted, while other components may be added, except where the context clearly indicates otherwise. The scope of the disclosure is intended to include all such combinations, modifications, and generalizations as well as their equivalents.

What is claimed is:

1. A method, comprising:
a) sensing a clock signal that exhibits cycles during normal operation, each cycle including two opposite state phase instances having respective first and second expected durations, and each phase instance having a beginning and an end;
b) responsive to sensing the beginning of a first phase instance, starting a first timer having a first timer duration at least as long as the first expected duration, wherein starting the first timer comprises generating a first pulse having a duration corresponding to the first timer duration;
c) comparing the first pulse with at least one version of the clock signal to determine if the first timer expires before the end of the first phase instance; and
d) if the first timer expires before the end of the first phase instance, asserting a first clock stop detection signal, else if the first timer does not expire before sensing the end of the first phase instance, resuming at step b.

2. The method of claim 1, further comprising:
e) responsive to sensing the beginning of a second phase instance, starting a second timer having a second timer duration at least as long as the second expected duration;
f) if the second timer expires before sensing the end of the second phase instance, asserting a second clock stop detection signal;
g) else if the second timer does not expire before sensing the end of the second phase instance, resuming at step e.

3. The method of claim 2, wherein:
the first and second phase instances occur within a same cycle of the clock signal.

4. The method of claim 2, wherein:
the clock signal has a 50% duty cycle and the first and second timer durations are equal.

5. The method of claim 2, further comprising:
asserting a third clock stop detection signal if either of the first or the second clock stop detection signals is asserted.

6. The method of claim 5, further comprising:
if the third clock stop detection signal is asserted, resetting one or more subsystems associated with a host system.

7. The method of claim 2, further comprising:
resetting one or more subsystems associated with a host system if either of the first or the second clock stop detection signals is asserted.

8. The method of claim 1, wherein:
the first timer duration is less than a cycle time of the clock signal.

9. The method of claim 2, wherein:
the second timer duration is less than a cycle time of the clock signal.

10. The method of claim 1, wherein:
sensing the beginning of the first phase instance comprises detecting an edge of the clock signal.

11. The method of claim 1, wherein:
the first phase instance corresponds to a low phase of the clock signal; and
the first clock stop detection signal signifies that the clock has stopped in a low state.

12. The method of claim 1, wherein:
comparing the first pulse with at least one version of the clock signal comprises comparing the first pulse with at least one of: the clock signal, an inverse of the clock signal, a phase extended version of the clock signal, or a phase extended version of the inverse of the clock signal.

13. The method of claim 1, wherein generating the first pulse comprises:
initiating a cascade of shorter pulses; and
composing signals derived from the cascade of shorter pulses.

14. The method of claim 1:
wherein the first pulse duration is longer than the first expected duration; and
further comprising truncating the first pulse responsive to sensing the end of the first phase instance.

15. The method of claim 13:
wherein the first pulse duration is longer than the first expected duration;
further comprising truncating the first pulse responsive to sensing the end of the first phase instance; and
wherein truncating the first pulse comprises interrupting the cascade of shorter pulses.

16. The method of claim 1, wherein:
the first pulse duration varies based on a speed of a circuit;
the speed of the circuit varies based on a PVT operating point of the circuit, where P corresponds to a fabrication process quality of the circuit, V corresponds to a supply voltage level of the circuit, and T corresponds to a temperature of the circuit;
the first pulse duration is shorter at a fastest specified PVT operating point of the circuit than at a slower PVT operating point of the circuit; and
generating the first pulse comprises generating a pulse that is at least as long as the first expected duration when the PVT operating point of the circuit corresponds to the fastest specified PVT operating point and is longer when the PVT operating point of the circuit corresponds to the slower PVT operating point.

17. The method of claim 16:
wherein the first pulse duration is longer than the first expected duration; and
further comprising truncating the first pulse responsive to sensing the end of the first phase instance.

18. The method of claim 17, wherein:
generating the first pulse comprises initiating a cascade of shorter pulses and composing signals derived from the cascade of shorter pulses; and
truncating the first pulse comprises interrupting the cascade of shorter pulses.

19. Clock anomaly detection circuitry, comprising:
a clock signal input for coupling to a clock signal that, during normal operation, oscillates between first and second clock states, wherein the first clock state corresponds to a first phase having a first phase expected duration and the second clock state corresponds to a second phase having a second phase expected duration;
an anomaly detection output; and
clock stopped detection logic coupled to the clock signal input and operable to assert the anomaly detection output if the clock signal remains in the first clock state longer than the first phase expected duration or remains in the second clock state longer than the second phase expected duration; wherein
a first edge of the clock signal signifies a start of a new clock phase having a new phase expected duration equal to one of the first or the second phase expected durations; and
the clock stopped detection logic comprises:
at least one edge triggered pulse generator that, when triggered responsive to the first edge of the clock signal, generates a pulse at a pulse output, the pulse having a pulse duration at least as long the new phase expected duration but not longer than an expected cycle time of the clock signal; and
one or more Boolean logic circuits configured to compare the pulse output with at least one version of the clock signal and, based on the comparison, to indicate if the pulse ends before the clock signal exhibits a second edge in a direction opposite to that of the first edge.

20. The circuitry of claim 19, wherein:
the clock stopped detection logic is operable to function without reference to a clock other than the clock signal.

21. The circuitry of claim 19, wherein the clock stopped detection logic comprises:
a clock stopped low detector having a clock stopped low output;
a clock stopped high detector having a clock stopped high output; and
one or more Boolean logic circuits operable to assert the anomaly detection output when either of the clock stopped low or the clock stopped high outputs is asserted.

22. The circuitry of claim 19, further comprising:
a host system having one or more subsystems operable responsive to the clock signal; and
a reset unit coupled to the anomaly detection output and operable to reset the one or more subsystems responsive to assertion of the anomaly detection output.

23. The circuitry of claim 19:
further comprising a phase extender circuit operable to generate a phase extended clock signal at a phase extender output such that the first edge is delayed, in the phase extended clock signal, by a time sufficiently long to allow the pulse to begin; and
wherein the one or more Boolean logic circuits comprise a logical NOR or a logical OR of the pulse generator output and the phase extender output.

24. The circuitry of claim 19:
wherein the at least one edge triggered pulse generator comprises a cascade of edge triggered pulse generators, each corresponding to a respective unit pulse output; and
further comprising unit pulse composition circuitry, coupled between the unit pulse outputs and the pulse output, and operable to generate the pulse by composing signals derived from the unit pulse outputs.

25. The circuitry of claim 24, wherein:
the unit pulse composition circuitry comprises a logical NOR or a logical OR of the unit pulse outputs.

26. The circuitry of claim 19:
wherein the pulse is longer than the new phase expected duration; and
further comprising circuitry operable to truncate the pulse responsive to the second edge.

27. The circuitry of claim 26, wherein:
the at least one edge triggered pulse generator comprises a cascade of edge triggered pulse generators, each corresponding to a respective unit pulse output;
the pulse comprises a composition of the unit pulse outputs; and
wherein the circuitry operable to truncate the pulse comprises circuitry operable to interrupt the cascade.

28. The circuitry of claim 27, wherein:
the circuitry operable to interrupt the cascade comprises a trigger output that indicates a logical NOR or a logical OR of an output from a previous edge triggered pulse generator in the cascade and at least one of: the clock signal, a phase extended version of the clock signal, an inverse of the clock signal, and a phase extended version of the inverse of the clock signal; and
the trigger output is coupled to an input of a subsequent edge triggered pulse generator in the cascade.

29. The circuitry of claim 19:
the pulse duration varies based on a speed of the at least one edge triggered pulse generator;
the speed of the at least one edge triggered pulse generator varies based on a PVT operating point of the at least one edge triggered pulse generator, where P corresponds to a fabrication process quality, V corresponds to a supply voltage level, and T corresponds to a temperature;
the pulse duration is shorter at a fastest specified PVT operating point than at a slower PVT operating point; and
the pulse duration is at least as long as the new phase expected duration at the fastest specified PVT operating point and is longer at the slower PVT operating point.

30. The circuitry of claim 29:
wherein the at least one edge triggered pulse generator comprises a cascade of edge triggered pulse generators, each corresponding to a respective unit pulse output;
further comprising unit pulse composition circuitry, coupled between the unit pulse outputs and the pulse output, and operable to generate the pulse by composing signals derived from the unit pulse outputs; and
wherein the cascade is sufficiently long that the pulse duration is at least as long as the new phase expected duration at the fastest specified PVT operating point when the cascade is not interrupted.

* * * * *